United States Patent
Furuya et al.

(10) Patent No.: US 8,512,540 B2
(45) Date of Patent: Aug. 20, 2013

(54) PLATING PROCESS AND MANUFACTURING PROCESS FOR SEMICONDUCTOR DEVICE THEREBY

(75) Inventors: Akira Furuya, Kanagawa (JP); Yasuaki Tsuchiya, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 102 days.

(21) Appl. No.: 13/044,222

(22) Filed: Mar. 9, 2011

(65) Prior Publication Data

US 2011/0155578 A1 Jun. 30, 2011

Related U.S. Application Data

(62) Division of application No. 11/408,172, filed on Apr. 21, 2006, now abandoned.

(30) Foreign Application Priority Data

Apr. 22, 2005 (JP) ................................ 2005-125782

(51) Int. Cl.
   *C25D 5/00* (2006.01)
   *C25D 21/12* (2006.01)

(52) U.S. Cl.
   USPC .......... 205/96; 205/82; 204/228.1; 204/228.8

(58) Field of Classification Search
   USPC ............................. 205/96; 204/228.8, 228.1
   See application file for complete search history.

(56) References Cited

U.S. PATENT DOCUMENTS

| | | | |
|---|---|---|---|
| 6,913,680 B1 | 7/2005 | Zheng et al. | |
| 2002/0008036 A1 | 1/2002 | Wang | |
| 2003/0196901 A1* | 10/2003 | Grunes | 205/88 |
| 2003/0201166 A1* | 10/2003 | Zheng et al. | 204/228.1 |
| 2004/0112756 A1* | 6/2004 | Boyd et al. | 205/291 |
| 2004/0245107 A1* | 12/2004 | Che et al. | 205/82 |
| 2005/0145500 A1* | 7/2005 | Toyoda et al. | 205/123 |
| 2006/0175201 A1 | 8/2006 | Hafezi et al. | |

FOREIGN PATENT DOCUMENTS

| | | |
|---|---|---|
| JP | 2001-32094 | 2/2001 |
| JP | 2003-129297 | 5/2003 |
| JP | 2004-218080 | 8/2004 |
| WO | WO 2004/094702 | 11/2004 |

OTHER PUBLICATIONS

Machine Translation of J.P. Pub. No. 2003-129297A.

(Continued)

*Primary Examiner* — Jonathan Johnson
*Assistant Examiner* — Bryan D. Ripa
(74) *Attorney, Agent, or Firm* — Young & Thompson

(57) ABSTRACT

An objective of this invention is to reliably form a plating film. The following two steps are sequentially conducted: a first step of connecting a film-formation surface of a wafer 109 to a cathode electrode 107, making the film-formation surface inclined from the surface of a plating solution 103 and immersing the wafer 109 into the plating solution 103 with applying a first current between the cathode electrode 107 and an Cu anode electrode 105 disposed in the plating solution 103, and second step of, after immersing the film-formation surface in the plating solution 103, applying a second current between the cathode electrode 107 and the Cu anode electrode 105 to form a metal film on the film-formation surface by electrolytic plating. In the first step, the first current is controlled on the basis of an inclination angle between the liquid surface and the film-formation surface.

16 Claims, 25 Drawing Sheets

(56) References Cited

OTHER PUBLICATIONS

Japanese Office Action dated May 24, 2011 in corresponding Japanese Application No. 2006-116933 with English translation of pertinent portion encircled in lines.

* cited by examiner

L ROTATES AROUND O
AT AN ANGULAR RATE ω

PLATING PROCESS AND MANUFACTURING PROCESS FOR SEMICONDUCTOR DEVICE THEREBY

This application is based on Japanese patent application No. 2005-125782, the content of which is incorporated hereinto by reference.

BACKGROUND

1. Technical Field

This invention relates to a plating process for forming a conducting film by electrolytic plating and a process for manufacturing a semiconductor device by the plating process, as well as a plating apparatus.

2. Related Art

A damascene process is one of processes for forming a Cu multilayer interconnection in an LSI. In a damascene process, a monolayer or multilayer insulating film is formed on an Si wafer with a transistor, and the insulating film is selectively removed to form a trench of an interconnection pattern and a hole called as a via for electrical connection between multilayer interconnection layers. Next, a material containing a high-melting metal called as a barrier metal is deposited by chemical vapor deposition or physical vapor deposition. Then, a Cu film called as a seed is deposited by chemical vapor deposition or physical vapor deposition. Cu is grown on the seed by electrolytic plating using the seed as a cathode to fill the trench and the hole with Cu. Subsequently, the barrier metal, the seed Cu and the plated Cu outside the trench and the hole are removed by chemical mechanical polishing. These steps are repeated to form a Cu multilayer interconnection.

In a damascene process, defective burying must be avoided in a Cu film burying process by Cu electrolytic plating. FIG. 19 is a cross-sectional view showing a configuration of a conventional standard Cu plating apparatus. FIG. 20 illustrates relationship between a time and a current applied between an anode electrode and a cathode electrode in the plating apparatus shown in FIG. 19.

A plating apparatus 200 shown in FIG. 19 has a plating bath 201, a plating solution 203 in the plating bath 201, a Cu anode 205 placed in the plating solution 203, a cathode electrode 207 and a power source (not shown). The cathode electrode 207 is placed the circumference of the wafer 209 with a Cu seed 211. In the plating apparatus 200, the cathode electrode 207 comes in contact with the circumference of the wafer 209 such that the film-formation surface in the wafer 209, specifically a surface on which the Cu seed 211 is to be formed and with being kept horizontal, they are immersed in the plating solution 203 to form a Cu film. During the immersion, the plating solution 203 is supplied to the wafer surface by an upward jet flow.

Since a growth rate in electrolytic plating is proportional to a current, film formation is conducted at a constant current in the light of film-thickness controllability. Since the plating solution 203 dissolves the Cu seed 211, a negative potential is applied between the Cu anode 205 and the cathode electrode 207 before and during immersing the wafer for preventing the Cu seed 211 from being dissolved in the plating solution. As shown in FIG. 20, the system is designed to apply a given current from the moment of liquid contact of the wafer 203.

As a method for controlling a current in horizontal bath immersion, Japanese Patent Application No. 2004-218080 has disclosed that constant-voltage and constant-current control is conducted before and after placing a plating solution. The application has described that defective burying can be thus prevented during plating a copper film over a semiconductor wafer.

However, the wafer 209 is actually immersed into the plating solution 203 with the surface of the plating solution 203 waves. Since the wafer 209 is put into the bath horizontally to the surface of the plating solution 203, the whole surface of the wafer 209 does not come into contact with the plating solution 203 at one time due to a wave as shown in FIG. 21. FIG. 21 is a cross-sectional view illustrating that the wafer 209 is moved down toward the surface of the plating solution 203. In the plating apparatus 200, a given current is applied to a narrow area where the wafer 209 is in contact with the plating solution 203, so that a current density may be considerably increased in a liquid-contacting area as shown in FIG. 22, causing undesired film formation. FIG. 22 shows relationship between a time, a current intensity and a current density in a conventional plating process.

In order to solve the problem, Japanese Patent Application No. 2001-32094 has disclosed that during a period from the initial contact of a surface to be plated with a plating solution to complete contact of the whole surface with the solution, a voltage is kept constant until the complete contact with the solution for preventing variation in a current density due to fluctuation in a liquid-contact area caused by a wave. The reference has described that the technique allows for plating with improved uniformity and appearance when plating a wafer with a metal seed.

However, since the wafer 209 is inserted horizontally to the liquid surface in the plating apparatus 200, bubbles may adhere to the interface between the surface of the wafer 209 and the plating solution 203. FIG. 23 is a cross-sectional view illustrating adhesion of bubbles to the surface of the wafer 209 in contact with the plating solution 203. In FIG. 23, an electric field is intensified in an area without bubbles 213. Once bubbles adhere to the surface of the wafer 209, plating does not proceed in an area with bubbles, which may cause defective burying. Thus, a current control has been actually difficult.

Attempting to solve the problem, Japanese Patent Application No. 2003-129297 has disclosed that a semiconductor wafer is immersed into a plating solution at an predetermined angle to the horizontal direction and in an immersion step, is applied a voltage equal to that applied in a film forming step after the immersion. The reference has described that immersion of the wafer at a given angle can prevent bubbles from being trapped by a hole in the wafer. Herein, immersing a wafer surface to be film-formed into a plating bath at an angle to the surface of a plating solution is called "inclined insertion" as appropriate.

SUMMARY OF THE INVENTION

However, after investigating the method described in Japanese Patent Application No. 2003-129297, the present inventors have found that stable film formation is difficult in spite of prevention of bubble adherence by inclined insertion of a wafer.

The present inventors have intensely investigated a cause of defective plating in inclined insertion of a wafer, and finally have found that the cause of defective plating is an increase in a current density unique to the particular insertion style, inclined insertion, which will be detailed below.

FIG. 24 is a cross-sectional view illustrating a configuration of a plating apparatus in which a wafer is inclined-inserted. A plating apparatus 220 shown in FIG. 24 has a plating bath 221, a plating solution 223 placed in the plating bath 221, a Cu anode 225 disposed in the plating solution 223, a cathode electrode (not shown) connected to a wafer 209 and a power source (not shown) applying a current between the Cu anode 225 and the cathode electrode. There is formed a Cu seed (not shown) on the film-formation surface of the wafer 209. The plating apparatus 220 has a basic configuration as in the plating apparatus 200 shown in FIG. 19, except that the wafer 209 is immersed into the plating solution 223 with being inclined to the liquid surface of the plating solution 223.

In the plating apparatus 220, a current density is increased in an area in contact with the liquid in the wafer 209 at an angle to the liquid surface of the plating solution 223, so that a Cu film excessively grows in this area. For solving the problem, lowering a voltage at the time of contacting with the liquid may be conceived, but when the wafer 209 is inclined-inserted, a current density varies in the course of immersion even under control for lowering a voltage in contrast to horizontal insertion. In inclined insertion, as the wafer 209 is immersed deeper, an area contacting with the liquid in the wafer 209 increases. If a resistance in the system decreases in inverse proportion to increase in an area contacting with the liquid, a current density is kept constant, but actually, they are not in such inverse relationship because of a fixed resistance of a part such as a cable in the machine and further because a seed (not shown in FIG. 24) or plating solution 223 is not in inverse proportion to an area contacting with the liquid. Thus, a current density is gradually decreased.

The wafer 209 is generally immersed into the plating solution 223 with being rotated. Therefore, when it is rotated at an adequate rate, a current density in an initial plating stage is lower at a position closer to the center of the wafer 209. The dotted line in FIG. 25 indicates the situation and FIG. 25 shows relationship between a plating time and a current density in constant-voltage type inclined insertion. The dotted line in FIG. 25 indicates that a current density in an initial plating stage is different between the center and the periphery in the wafer 209, leading to difference in Cu film burying between the center and the periphery in the wafer 209.

After intense investigation for preventing fluctuation in a current density newly generated during inclined insertion of a wafer in a plating solution, the present inventors have found that fluctuation in a current density can be prevented by controlling a current on the basis of an inclination angle of the wafer from the liquid surface of the plating solution in the course of immersing a wafer, finally achieving this invention.

According to an aspect of this invention, there is provided a plating process comprising a first step of connecting a film-formation surface of a wafer to a cathode electrode, inclining the wafer to the surface of a plating solution and immersing the wafer into the plating solution with applying a first current between the cathode electrode and an anode electrode placed in the plating solution, and a second step of, after immersing the film-formation surface in the plating solution, applying a second current between the cathode electrode and the anode electrode to form a metal film on the film-formation surface by electrolytic plating, wherein in the first step, the first current is controlled on the basis of an inclination angle between the liquid surface and the film-formation surface.

In the first step of the plating process of this invention, the wafer is inclined-inserted with applying the first current between the cathode electrode and the anode electrode and controlling the first current depending on an inclination angle of the surface between the plating solution and the film-formation surface of the wafer. Thus, it can effectively prevent fluctuation in a current density generated in the initial plating stage during the inclined insertion. It can, therefore, improve stability in the formation of a metal film and improve an yield of producing a plated film.

In the first step in the plating process of this invention, the first current applied between the anode electrode and the cathode electrode may be controlled, taking factors other than an inclination angle into account. For example, in the first step, the current may be controlled in the light of, in addition to an inclination angle, a speed in the direction of the normal line in the film-formation surface of the wafer and an elapsed time after the wafer contacts with the liquid. It can further reliably prevent fluctuation in a current density in the first step. Furthermore, in the first step, the first current may be controlled, neglecting fluctuation in an inclination angle within a given range.

According to another aspect of the present invention, there is provided a process for manufacturing a semiconductor device having a metal film, comprising forming the metal film on the wafer by the plating process as described above.

In the manufacturing process of this invention, a metal film is formed on a wafer by the plating process as described above, so that even when forming a fine metal film pattern in a semiconductor device, defective burying of the metal film and local increase in a film thickness can be prevented, resulting in stable film formation. Thus, an yield in manufacturing a semiconductor device can be improved.

According to another aspect of the present invention, there is provided a plating apparatus, comprising a plating bath to be filled with a plating solution, a wafer holding unit whereby a film-formation surface of a wafer is held at an angle to the surface of the plating solution, a wafer moving unit whereby the wafer held by the wafer holding unit is immersed into the plating solution, a cathode electrode feeding a current to the wafer when it comes into contact with the wafer, an anode electrode placed in the plating bath such that it faces the wafer holding unit, a power source for applying a current between the anode electrode and the cathode electrode, and a controller controlling a current intensity applied between the anode electrode and the cathode electrode on the basis of an inclination angle of the film-formation surface from the liquid surface.

The plating apparatus according to this invention has a configuration where the wafer holding unit holds the film-formation surface at an inclined angle to the liquid surface and the controller controls a current intensity on the basis of the inclination angle. Thus, the configuration can effectively prevent fluctuation in a current density generated during inclined insertion with allowing for stably inclined-inserting the wafer.

Any combination of these elements and any variation of this invention interconverted between a process and an apparatus are also effective as aspects of this invention.

According to this invention, a plated film can be stably grown by inclining the wafer to the surface of a plating solution, immersing the wafer into the plating solution with applying the first current between a cathode electrode and an anode electrode and controlling the first current on the basis of an inclination angle of the film-formation surface from the liquid surface.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Embodiments of this invention will be described with reference to the drawings, using formation of a Cu film on a silicon wafer by electrolytic plating as an example. In all of the drawings, a common element is indicated by an identical symbol, and a common explanation is appropriately not repeated in the following description. In the following embodiments, a wafer may be a semiconductor substrate such as silicon, gallium and arsenic or an insulating substrate such as a glass substrate and a resin substrate. The wafer may be a substrate itself or a substrate on which are formed some elements such as semiconductor elements and interconnections.

Embodiment 1

Figure 1:
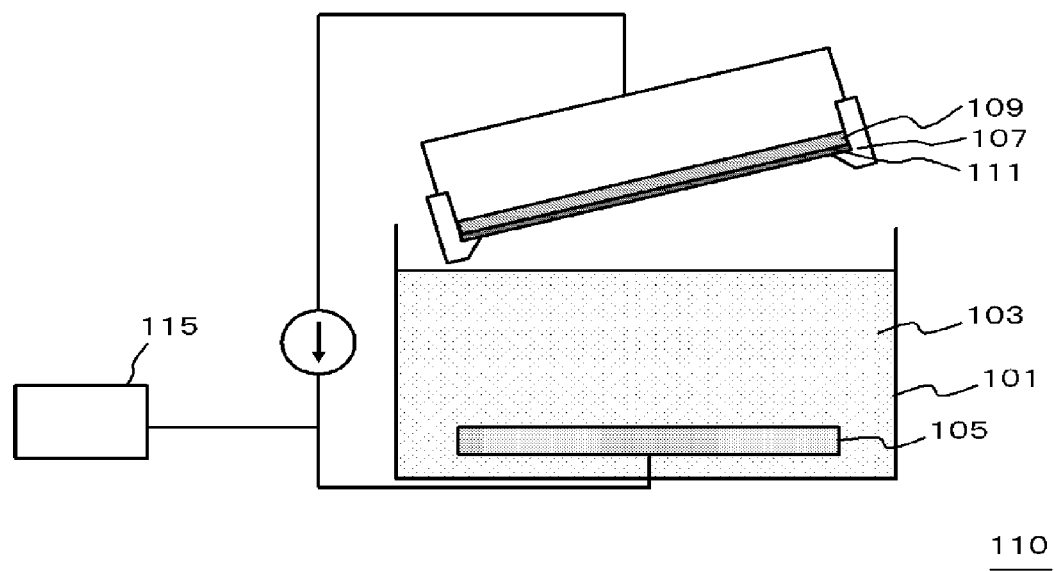
FIG. 1 is a cross-sectional view illustrating a configuration of a plating apparatus according to an embodiment of this invention.
Figure 5:
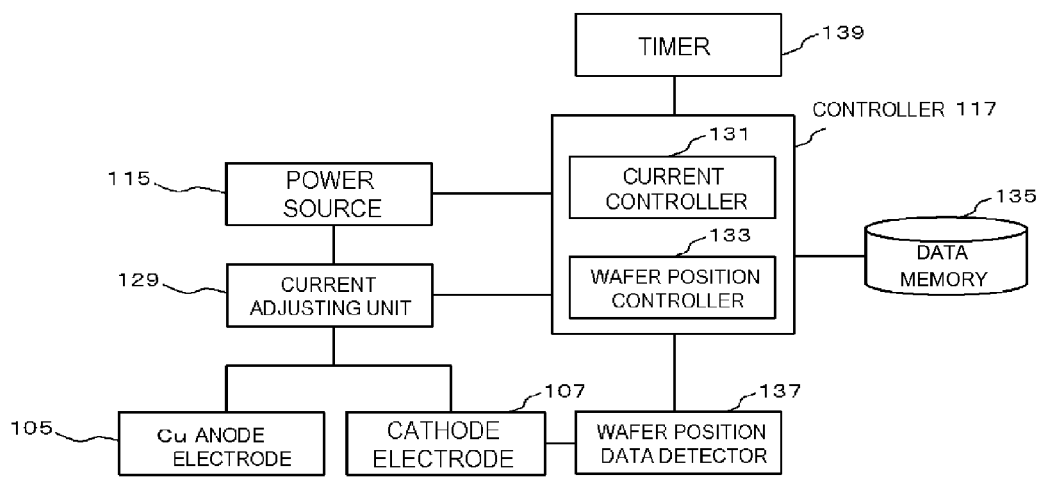
FIG. 5 is a block diagram illustrating a configuration of a controlling system in the plating apparatus in FIG. 1.

FIG. 1 is a cross-sectional view illustrating a configuration of a plating apparatus in this embodiment. The plating apparatus 110 shown in FIG. 1 has a plating bath 101 to be filled with a plating solution 103, a wafer moving unit (a driving unit, not shown) whereby a wafer 109 held by a cathode electrode 107 is immersed into the plating solution 103, the cathode electrode 107 feeding a current to the wafer 109 when it comes into contact with the wafer 109, an anode electrode (Cu anode electrode 105) disposed in the plating bath 101 such that it faces the cathode electrode 107, a power source 115 for applying a current between the Cu anode electrode 105 and the cathode electrode 107, and a controller 117 controlling a current intensity applied between the Cu anode electrode 105 and the cathode electrode 107 on the basis of an inclination angle of the film-formation surface from the liquid surface (FIG. 5). The cathode electrode 107 acts as a wafer holding unit which holds the film-formation surface of the wafer 109 at an angle of the wafer 109 to the liquid surface of the plating solution 103. The cathode electrode 107 is formed in contact with a Cu seed 111 formed on the plating surface of the wafer 109, and allows the Cu seed 111 to act as a cathode in electrolytic plating. As a wafer holding unit, it may have a rotating terminal board which is rotatable and holds the wafer 109 such that at least the surface of the wafer 109 is in contact with the plating solution 103.

The plating apparatus 110 further has a current adjusting unit 129 (FIG. 5) for adjusting a current intensity applied from the power source 115 and then applying a current between the Cu anode electrode 105 and the cathode electrode 107, and the controller 117 controls the current adjusting unit 129 on the basis of an inclination angle. The controller 117 adjusts a current in response to a liquid contact area in the wafer 109. A liquid contact area in the wafer 109 is a function of an inclination angle as a variable.

The plating apparatus 110 also has a wafer position controller 133(FIG. 5) for controlling an inclination angle and a lowering speed of the wafer 109.

There will be further described the configuration of the plating apparatus 110.

The plating apparatus 110 has the plating bath 101; the Cu anode electrode 105 disposed in the plating bath 101; the cathode electrode 107 disposed over the plating bath 101 and holding the wafer 109; the power source 115 applying a current between the Cu anode electrode 105 and the cathode electrode 107; and the controller 117 for controlling movement of the cathode electrode 107. The plating bath 101 is filled with the plating solution 103. The cathode electrode 107 holds the wafer 109 at an angle to the liquid surface of the plating solution 103, and is rotatable and movable to directions toward and away from the Cu anode electrode 105. The cathode electrode 107 holds the wafer 109 such that it is electrically connected to the Cu seed 111 as a seed metal layer formed on the wafer 109.

Although being not shown, the plating bath 101 may be disposed in the course of a circulating path for the plating solution 103. For example, the machine has a configuration where the plating solution 103 is discharged from the plating bath 101 and then received by another plating solution chamber (not shown), where it is then controlled to a desired temperature, filtrated by, for example, a filter and again introduced into the plating bath 101 from an inlet (not shown).

A current applied between the Cu anode electrode 105 and the cathode electrode 107 is controlled by a controller (not shown in FIG. 1, but shown in FIG. 5). FIG. 5 is a block diagram illustrating a configuration of a control system for the plating apparatus 110. The plating apparatus 110 further has the controller 117, a current adjusting unit 129 for adjusting a current from the power source 115 to a given intensity and then applying it between the Cu anode electrode 105 and the cathode electrode 107, a data memory 135 for storing a current control process in the controller 117, a wafer position data detector 137 for detecting a position of the wafer 109, and a timer 139.

The data memory 135 stores data on an immersion process for the wafer 109 and data on a current applied between the Cu anode electrode 105 and the cathode electrode 107. The data on an immersion process for the wafer 109 may include an inclination angle θ between the wafer 109 and the liquid surface of the plating solution 103, and a speed of immersing the wafer 109. The data on a current may include a table of a current intensity I associated with an elapsed time after the wafer contacts with the liquid. The current intensity I meets the relation of formula (1) described later.

The timer 139 measures an elapsed time from immersion initiation, assuming that t=0 when the wafer 109 comes into contact with the plating solution 103. The controller 117 has a current controller 131 and a wafer position controller 133.

The wafer position controller 133 acquires the data on a lowering speed of the cathode electrode 107 stored in the data memory 135 and the data on an inclination angle between the wafer 109 and the liquid surface of the plating solution 103, and controls operation of a driving unit for the cathode electrode 107 (not shown). Controlling the operation of the cathode electrode 107 by the wafer position controller 133 results in controlling a lowering speed of the wafer 109 and an inclination angle of the wafer 109. Although both inclination angle and lowering speed are constant (invariable) in this embodiment, they may be variable; for example, their data may be stored in the data memory 135 as data associated with a time. When an inclination angle is variable, the wafer position controller 133 controls the position of the wafer 109. This case will be described later in Embodiment 3.

The current controller 131 controls the intensity of a current I applied between the Cu anode electrode 105 and the cathode electrode 107 with acquiring an elapsed time measured by the timer 139 and current data associated with a time stored in the data memory 135.

The current adjusting unit 129 adjusts a current from the power source 115 to a given intensity and applyies it between the Cu anode electrode 105 and the cathode electrode 107. The power source 115 may, for example, supply a given constant current.

The wafer position data detector 137 detects a liquid contact time, that is, an immersion initiation time (t=0) by detecting a position of the wafer 109, specifically a height from the plating solution 103. Alternatively, the wafer position data detector 137 may detect a position of the wafer 109, specifically its inclination angle to the liquid surface.

Here, an immersion initiation time and an inclination angle of the wafer 109 to the liquid surface of the plating solution 103 can be, for example, detected by measuring a step number of a driving unit specifically a motor for the cathode electrode 107 (not shown). The step number until the wafer 109 contacts the plating solution 103 or becomes the predetermined inclining angle is acquired by preliminary measurement. The data memory 135 stores the measured step number. Then, when the step number detected by the wafer position data detector 137 reaches the step number stored in the data memory 135 in the course of plating, the wafer position controller 133 judges that the wafer 109 contacts with the plating solution 103 or becomes predetermined inclining angle and controls a current applied between the electrodes. Furthermore, a weak voltage can be applied before contacting with the plating solution 103 and a position and an angle at the moment of current flow can be determined as a position and an angle when the wafer 109 contacts with the plating solution 103, respectively.

Figure 2:
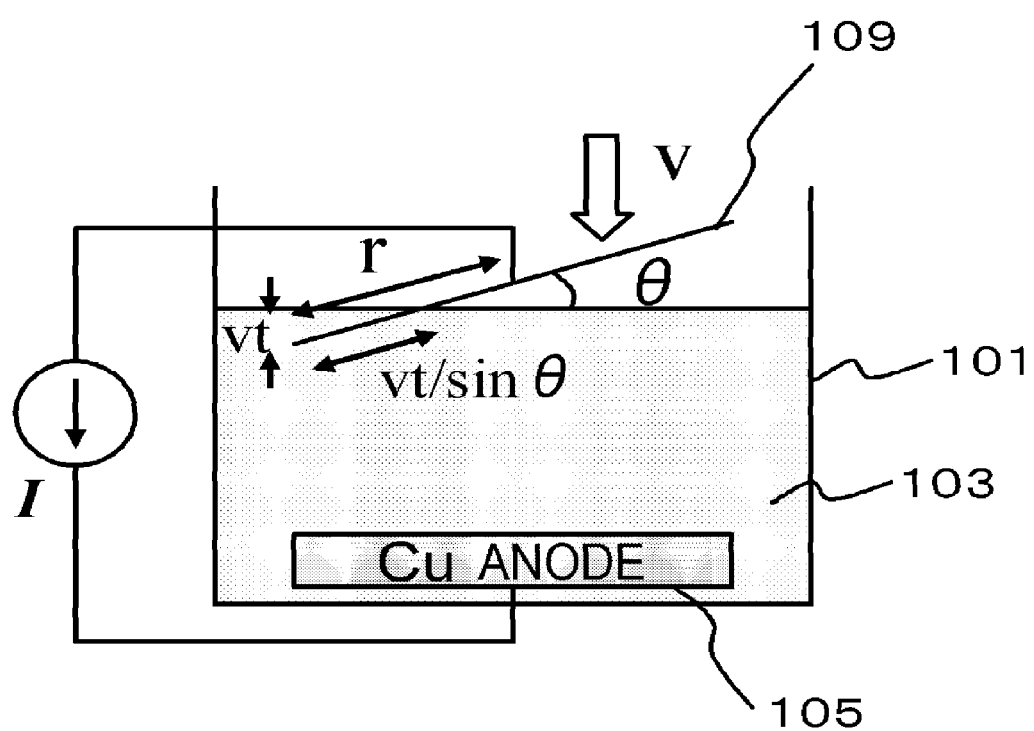
FIG. 2 illustrates a plating process using the plating apparatus 110 in FIG. 1.
Figure 3:
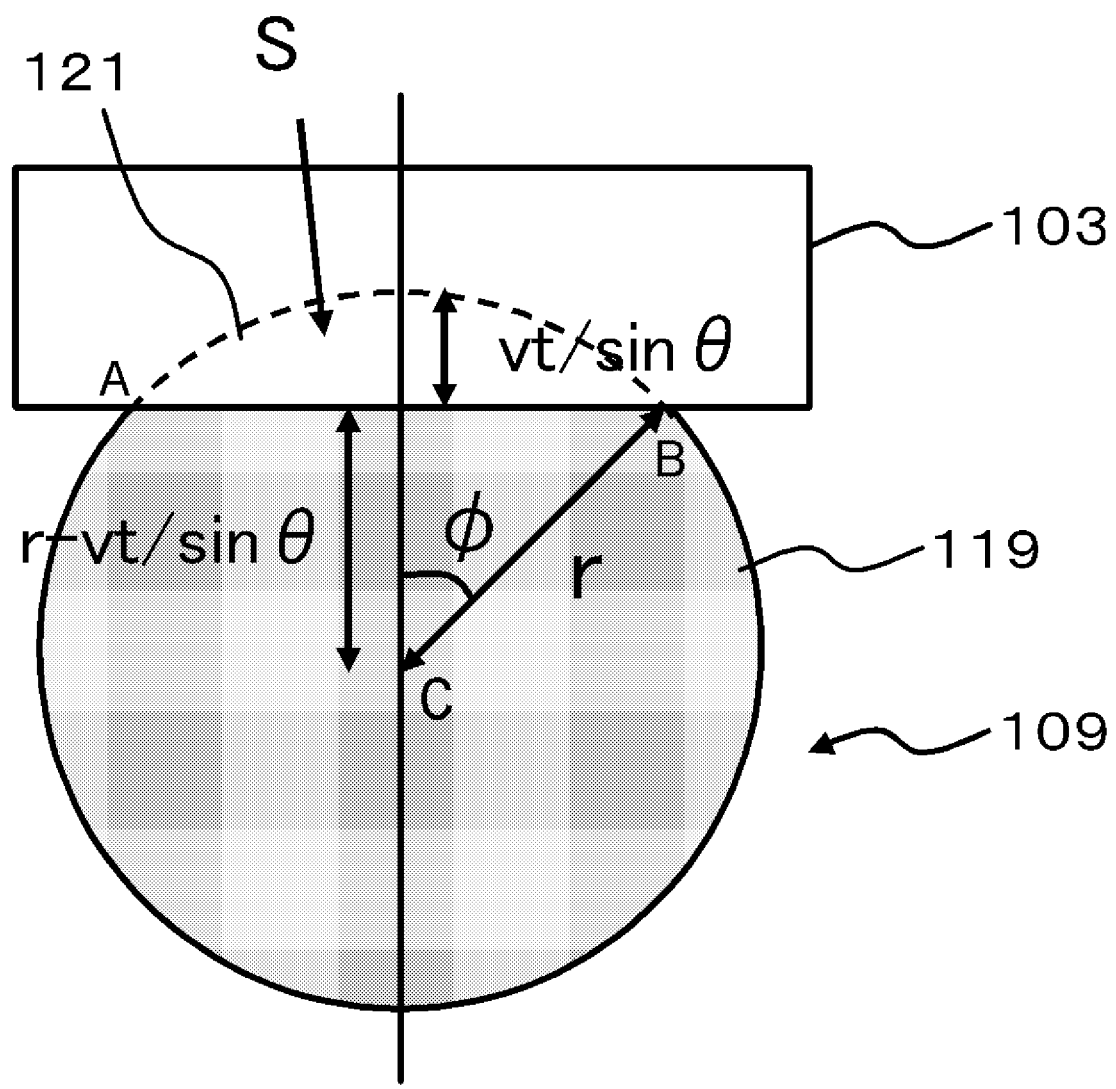
FIG. 3 illustrates a plating process using the plating apparatus 110 in FIG. 1.
Figure 4:
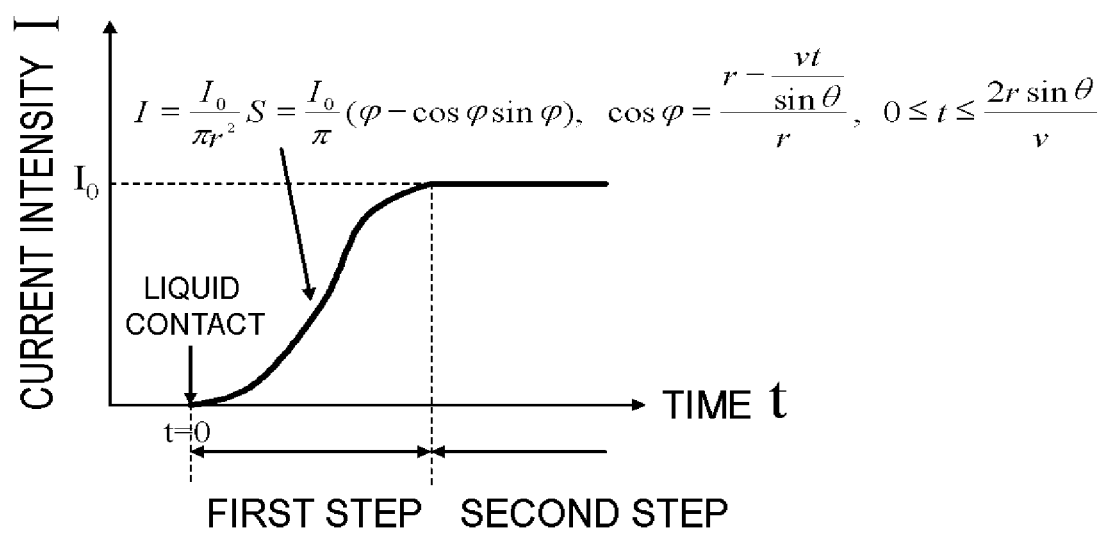
FIG. 4 shows a current intensity applied between a Cu anode electrode and a cathode electrode in each step in a plating process according to the embodiment.

There will be described a plating process according to this embodiment. FIGS. 2 and 3 illustrate a plating process using the plating apparatus 110. FIGS. 2 and 3 are a cross-sectional and plane views illustrating immersion of the wafer 109 into the plating solution 103, respectively. FIG. 4 shows relationship between an elapsed time t where t=0 means that the wafer 109 contacts with the plating solution 103 and a current intensity I applied between the Cu anode electrode 105 and the cathode electrode 107 in the plating apparatus 110. The plating process of this embodiment will be described with reference to FIGS. 1 to 5.

The plating process of this embodiment has the following steps:

first step: the film-formation surface of the wafer 109 is connected to the cathode electrode 107, the wafer 109 is inclined to the surface of the plating solution 103 and immersed into the plating solution 103 with applying a first current between the cathode electrode 107 and the Cu anode electrode 105 placed in the plating solution 103; and second step: after immersing the film-formation surface in the plating solution 103, a second current is applied between the cathode electrode 107 and the Cu anode electrode 105 to form a metal film on the film-formation surface by electrolytic plating.

In the first step, the first current is controlled on the basis of an inclination angle between the liquid surface and the film-formation surface. The metal film is, for example, a copper-containing metal film.

In the first step, the wafer 109 is gradually immersed with keeping the film-formation surface at a given angle θ to the plating solution 103 until the wafer 109 is completely immersed in the plating solution 103. In this embodiment, the second step is performed after immersing the whole film-formation surface in the plating solution 103 while a substantially constant current I is applied between the Cu anode electrode 105 and the cathode electrode 107. In this embodiment, a current intensity is controlled in each step.

In the first step, a liquid-contact area in the wafer 109 takes an inclination angle as a variable and the first current varies depending on the liquid-contact area. Here, a liquid-contact area in the wafer 109 is an area of the plating surface of the wafer 109 under the liquid surface of the plating solution 103 in the direction to the bottom of the plating bath 101. In the first step, specifically, the first current is varied in proportion to a liquid-contact area as in the following equation:

$$I(t)=I_0/\pi r^2 \times S(t)$$

wherein I(t) is a current intensity at a time t which is applied between the electrodes in the first step and $I_0$ is a current intensity in the second step, S(t) is a liquid-contact area in the film-formation surface at time t and r is a radius of the wafer 109. S and I are functions of t.

In the first step in this embodiment, the inclination angle θ is substantially constant and the wafer 109 is immersed into the plating solution 103 at a substantially constant speed. As used herein, the term "substantially constant" means that θ or v is kept constant such that variation in a current density i caused by fluctuation in θ or v is negligible, and thus an inclination angle or a speed may be somewhat varied within the range.

In the first step, the wafer position controller 133 drives the wafer 109 to move down in the direction vertical to the liquid surface with holding the wafer 109 at an angle to the liquid surface of the plating solution 103, and to immerse the wafer 109 into the plating solution 103 at a constant speed. Here, the wafer 109 is immersed with being rotated around the central axis.

In the first step, the current controller 131 controls ON/OFF of the power source 115 and the operation of the current adjusting unit 129. The current controller 131 controls the power source 115 and the current adjusting unit 129 to apply a current I with an intensity represented by equation (1). Where θ is an inclination angle between the wafer 109 and the liquid surface of the plating solution 103, r is a radius of the wafer 109, v is a lowering speed of the wafer 109 which is herein a speed in a direction of the normal line of the liquid surface of the plating solution 103, t is an elapsed time after the wafer 109 contacts with the plating solution 103 of the wafer 109, and $I_0$ is a current in the second step, a current represented by equation (1) is applied between the Cu anode electrode 105 and the cathode electrode 107 in the first step.

$$I=(I_0/\pi r^2) \times S=I_0(\phi - \cos \phi \sin \phi/\pi) \quad (1)$$

wherein $I_0$ is the intensity of the second current and 2φ is an angular aperture of the liquid-contacting part to the wafer center, that is, the angle of an ark of the outer edge of the wafer 109 not contacting with the plating solution 103. As shown in FIG. 3, 2φ is an angle made by a straight line passing through points A and C and a straight line passing through points B and C. Here, the points A and B are intersections of outer edge of the wafer 109 with the surface of the plating solution 103, and the point C is the wafer center.

Furthermore, in this embodiment, φ and t meet the conditions: cos φ=(r−vt/sin θ)/r, b 0≦t≦2r sin φ/v. In this embodiment, v is substantially constant.

FIG. 4 shows a current intensity applied between the Cu anode electrode 105 and the cathode electrode 107 in each step in the plating process according to this embodiment. As shown in FIG. 4, in the first step, a current represented by equation (1) is applied, and in the second step after the whole plated surface in the wafer 109 contacts with the plating solution 103, a current intensity is constant.

There will be described effects of this embodiment. In this embodiment, the wafer 109 is immersed at a constant angle θ from the liquid surface of the plating solution 103. Then, a current intensity until the completion of the immersion is controlled by the controller, taking an inclination angle θ, an immersion speed v and an elapsed time t after the wafer 109 contacts with the plating solution 103 into consideration. Thus, the following advantages can be achieved.

Figure 6:
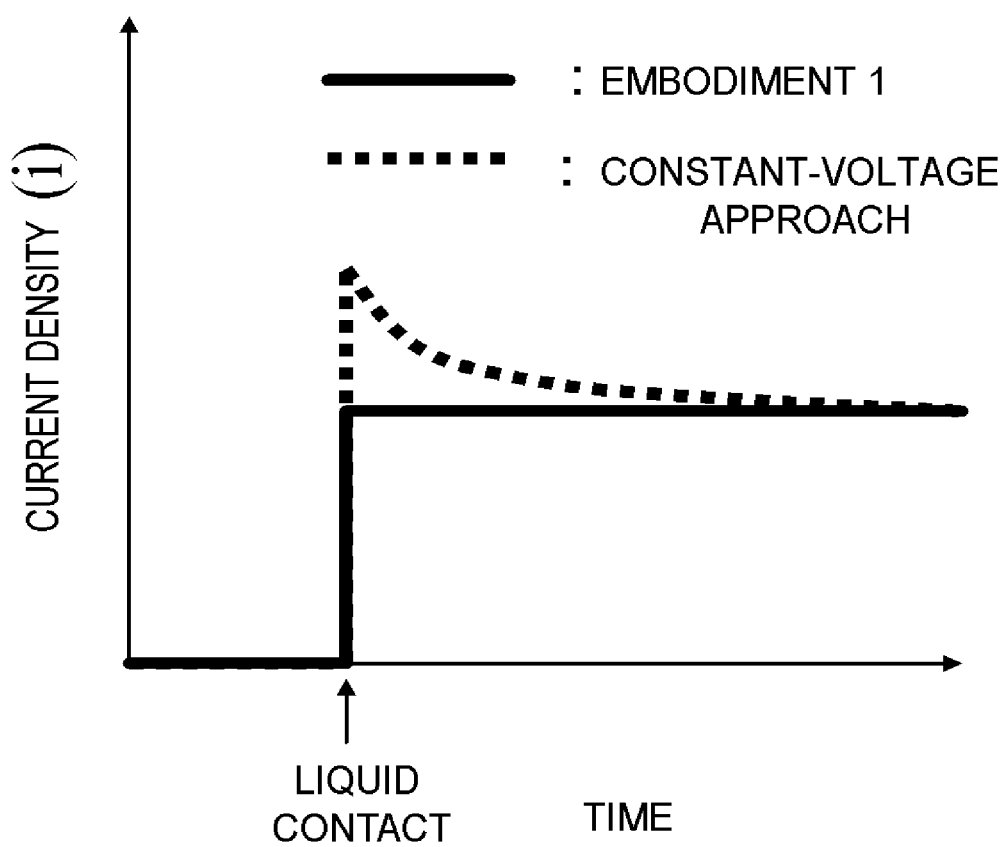
FIG. 6 shows relationship between an elapsed time after a wafer contacts with a liquid and a current density in the plating process according to this embodiment and a conventional plating process.

First, local increase in a current density can be prevented in the plated surface of the wafer 109. FIG. 6 shows relationship between an elapsed time t after the wafer 109 contacts with the plating solution 103 and a current density i in a plating process according to this embodiment and in a plating process in a constant-voltage approach. As indicated by a dotted line in FIG. 6, in a constant-voltage approach, a current density sometimes suddenly increase immediately after the wafer 109 contacts with the plating solution 103.

In contrast, in the first step in this embodiment, a current between the both electrodes from the power source 115 is controlled such that an area of the liquid-contacting surface in the wafer 109 is proportional to a current intensity between the Cu anode electrode 105 and the cathode electrode 107, taking an inclination angle θ, an immersion speed v and an elapsed time t from contacting with the plating solution 103 into consideration. Thus, as indicated by a solid line in FIG. 6, significant increase of a current density can be prevented to keep a current density constant immediately after the wafer 109 contacts with the plating solution 103, regardless of a liquid-contacting area in the wafer 109. Therefore, even when the wafer 109 is immersed at an angle to the liquid surface of the plating solution 103, fluctuation in burying can be prevented in the plated surface of the wafer 109, resulting in stable film formation.

Because a current represented by equation (1) is applied until completion of the immersion, and a current intensity is controlled to be, at the completion of the immersion, identical to the constant current intensity $I_0$ applied between the electrodes in the second step, the transition from the immersion step to the film formation step can be stably conducted.

Secondly, immersing the wafer 109 with inclining to the liquid surface can prevent bubbles from adhering to the surface of the wafer 109, so that local defective formation of a plating film due to bubble adhesion and local increase in a film thickness can be prevented, resulting in reliable growth.

Thirdly, since inclined insertion is employed in the first step, adhesion of bubbles to the surface of the wafer 109 can be prevented and even when there is a wave generated in the plating solution 103, deterioration in burying properties in the plating film can be prevented because of the following reason. In the initial immersion stage where a liquid-contacting area is small, an immersion position of the wafer is at the end of the plating apparatus where the wave is smaller than at the center and thus influence of the wave is negligible. When the wafer 109 is immersed in the center where a wave of the plating solution 103 is bigger, a liquid-contacting area of the wafer 109 is already adequately large, so that influence of the wave is also negligible. Therefore, burying properties in the center of the wafer 109 can be comparable to those in its end.

Embodiment 2

This embodiment relates to another process for controlling a current applied between a cathode electrode and an anode electrode in electrolytic plating using the plating apparatus 110. In embodiment 1, a current intensity applied between a cathode electrode and an anode electrode is controlled in accordance with the above equation (1) in the first step in forming a plating film. In this embodiment, the wafer 109 is immersed into the plating solution at a substantially constant speed while a current intensity applied between the electrodes is varied in proportion to an elapsed time t after the wafer 109 contacts with the plating solution 103 in the first step.

Specifically, in step 101 described above in embodiment 1, a current intensity I represented by the following equation (2) instead of equation (1) is applied.

$$I = I_0 t / t_0 \quad (2)$$

wherein $I_0$ is an intensity of the second current and $t_0$ is a time of completion of the first step.

More specifically, in this embodiment, θ is constant and a current intensity I represented by equation (3) is applied in the first step.

$$I = I_0 t / t_0 \quad (3)$$
$$= (v I_0 / 2 r \sin\theta) \times t$$

wherein $I_0$ is an intensity of the second current, r is a radius of the wafer 109, θ is an inclination angle and v is a lowering speed of the wafer 109 in the direction of the normal line of the liquid surface. In this embodiment, v is substantially constant and $0 \leq t \leq 2r \sin\theta / v$.

Figure 7:
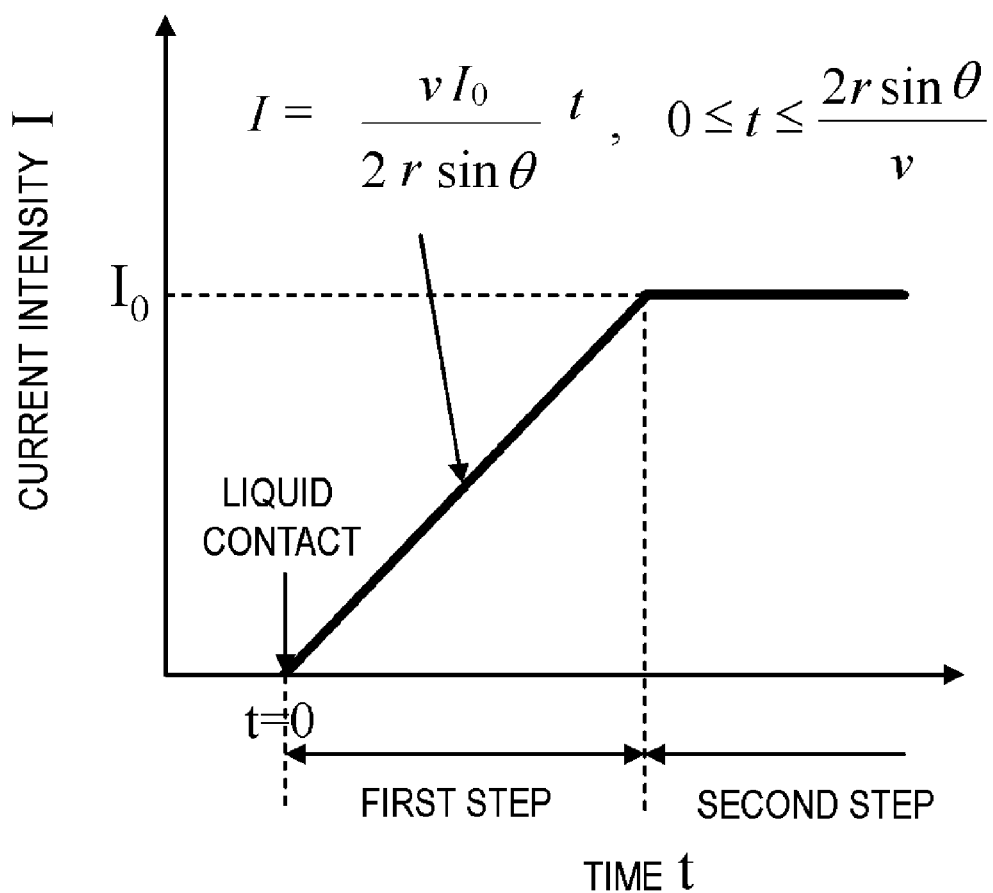
FIG. 7 shows a current intensity applied between a Cu anode electrode and a cathode electrode in each step in a plating process according to the embodiment.

FIG. 7 shows a current intensity applied between the Cu anode electrode 105 and the cathode electrode 107 in each step in the plating process of this embodiment. As seen in FIG. 7, in the first step, a current represented by the above equation (2) is applied, and in the second step after the whole plated surface of the wafer 109 contacts with the plating solution 103, a current intensity is constant.

Figure 8:
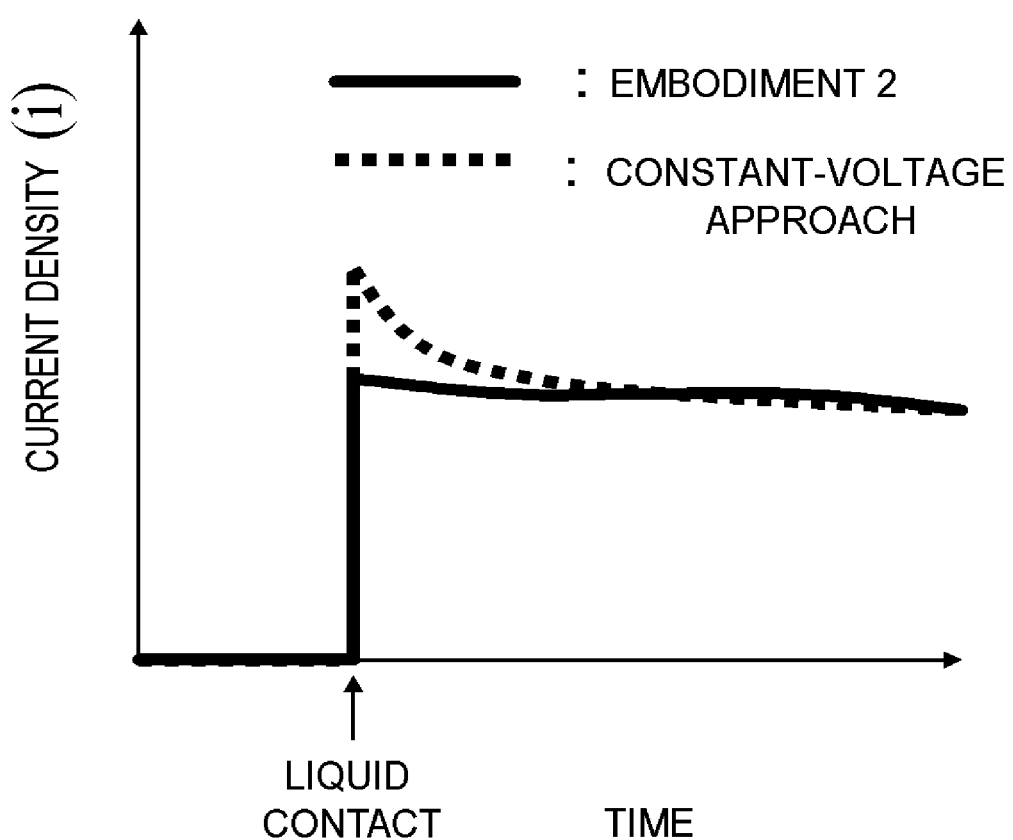
FIG. 8 shows relationship between an elapsed time after a wafer contacts with a liquid and a current density in the plating process according to this embodiment and a conventional plating process.

FIG. 8 shows relationship between an elapsed time and a current density in the plating process of this embodiment and a conventional plating process. As shown in FIG. 8, this embodiment can also prevent sudden increase in a current density immediately after the wafer 109 contacts with the plating solution 103 and prevent fluctuation in a current density associated with an elapsed time in comparison with a conventional constant-voltage approach, so that burying uniformity in the plated surface of the wafer 109 and stability to form film can be improved. Furthermore, the process may be more convenient than the current control process in the first step in embodiment 1.

Embodiment 3

This embodiment relates to another process for controlling a current applied between a cathode electrode and an anode electrode in electrolytic plating using the plating apparatus 110. Although there has been described immersion with a constant inclination angle θ of the wafer 109 from the plating solution 103 in embodiments 1 and 2 as examples, an inclination angle θ may be a time-dependent variable.

Figure 9:
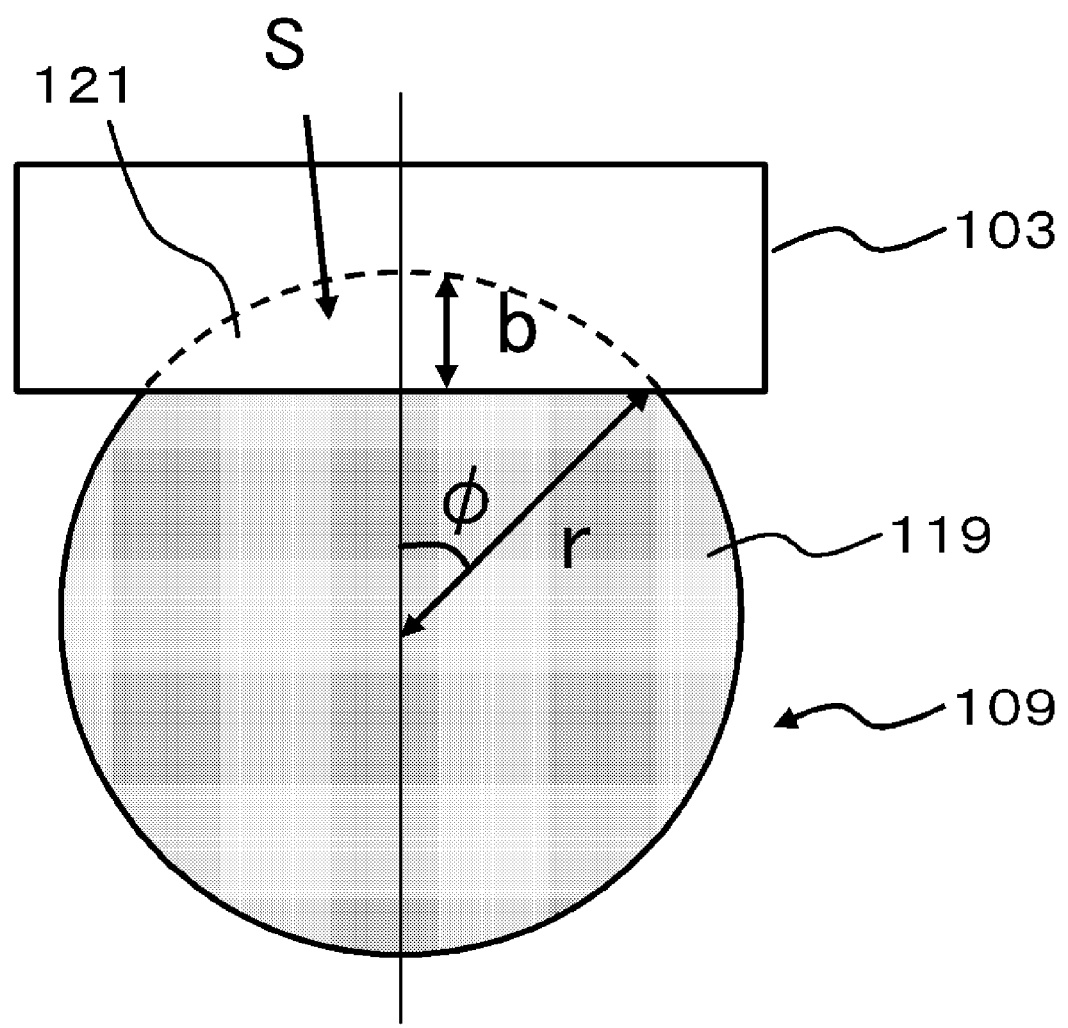
FIG. 9 illustrates a plating process according to an embodiment of this invention.
Figure 11A:
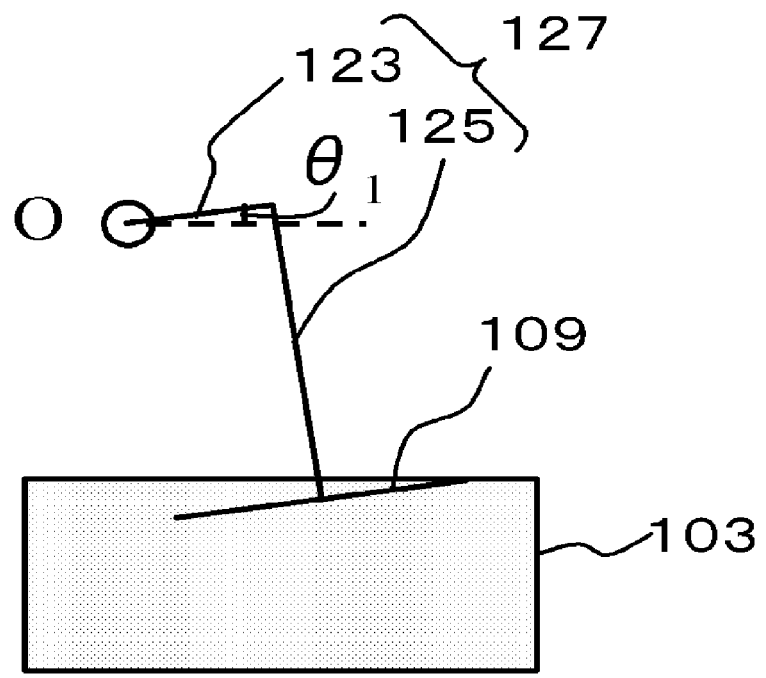
FIGS. 11A and 11B illustrate a plating process according to an embodiment of this invention.
Figure 11B:
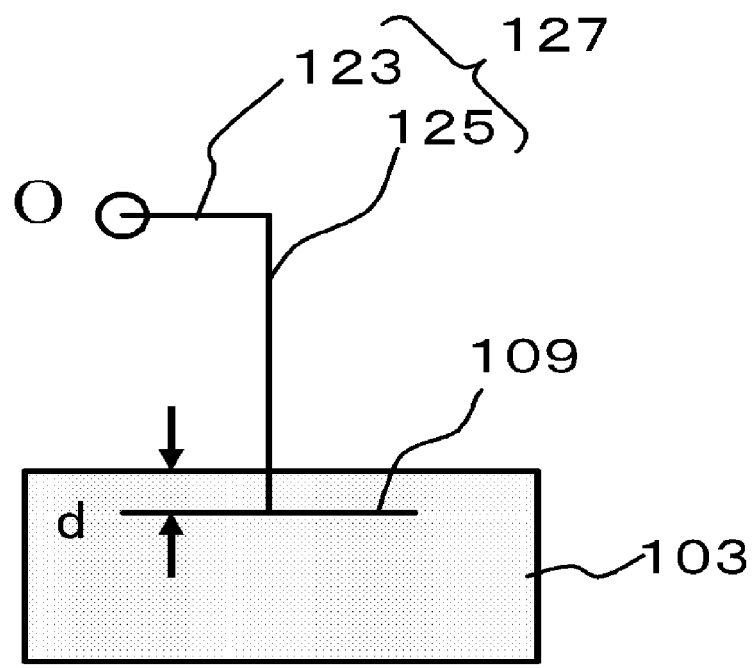
Figure 12:
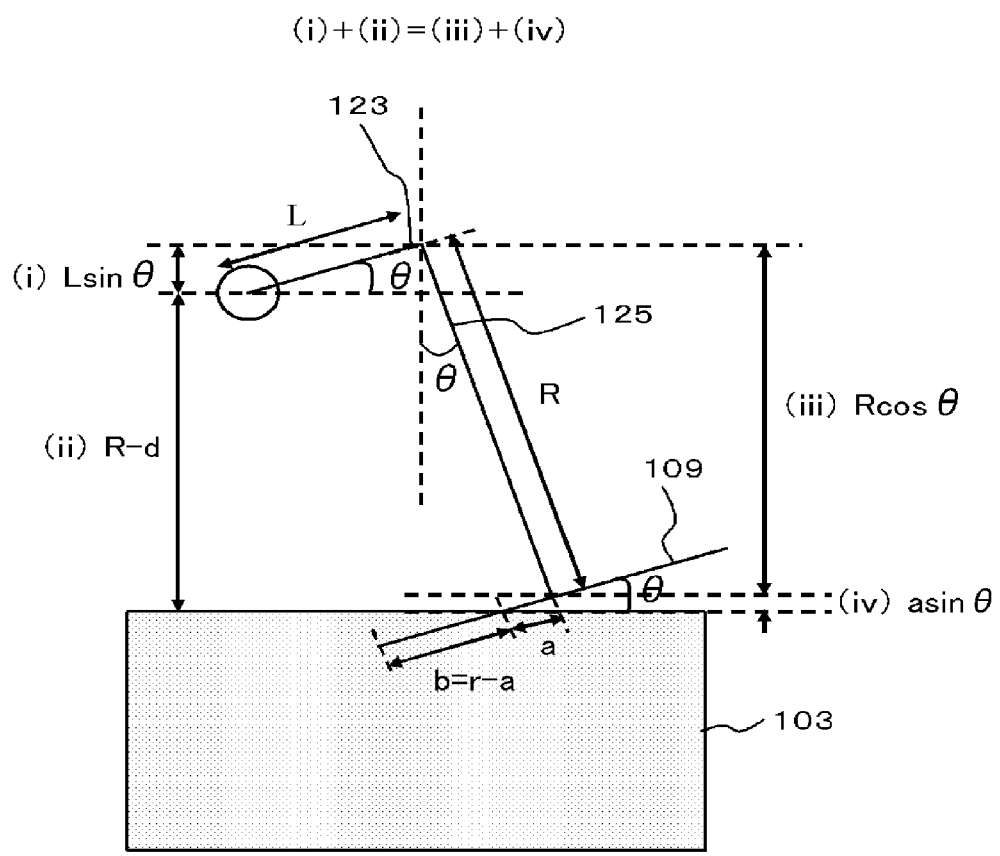
FIG. 12 illustrates a plating process according to an embodiment of this invention.
Figure 13:
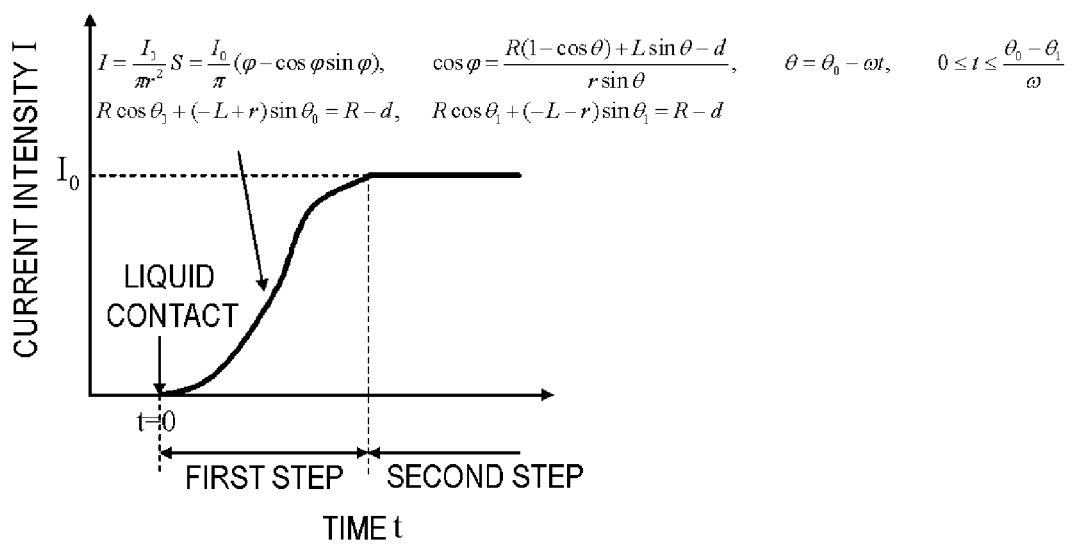
FIG. 13 shows relationship between an elapsed time after a wafer contacts with a liquid and a current intensity applied between the electrodes in a plating apparatus according to an embodiment of this invention.

FIGS. 9, 10A, 10B, 11A, 11B and 12 illustrate a plating process using the plating apparatus 110. FIG. 9 is a plane view illustrating immersion of the wafer 109 into the plating solution 103. FIGS. 10A, 10B, 11A, 11B and 12 are cross-sectional views illustrating immersion of the wafer 109 into the plating solution 103. FIG. 13 shows relationship between an elapsed time after the wafer 109 contacts with the plating solution 103 and a current intensity I applied between the Cu anode electrode 105 and the cathode electrode 107 in the plating apparatus 110.

As shown in FIGS. 10A, 10B, 11A, 11B and 12, in this embodiment, the plating apparatus 110 further has a wafer holding part 127 by which the wafer 109 is rotated around a given position O. The wafer holding part 127 has a horizontal part 123 parallel to the surface of the wafer 109 and a shank 125 parallel to the direction of the normal line of the wafer 109, and has an L-shape cross section. The wafer position controller 133 rotates the wafer holding part 127 at a given rate around one end of the horizontal part 123, more specifically the end O in the side which is not connected to the shank 125. Then, the wafer 109 held by the wafer holding part 127 is immersed into the plating solution 103.

There will be described the plating process of this embodiment with reference to FIGS. 9 to 13.

Figure 10A:
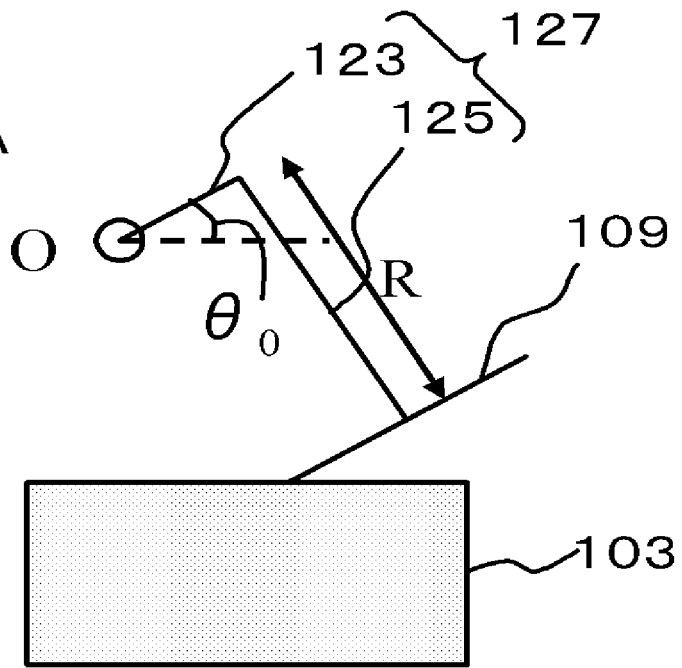
FIGS. 10A and 10B illustrate a plating process according to an embodiment of this invention.

The wafer position controller 133 rotates the wafer holding part 127 at an angular rate ω around O. Then, as shown in FIG. 10A, the end of the wafer 109 comes into contact with the plating solution 103. The liquid-contact time is defined as t=0, and an angle between the liquid surface of the plating solution 103 and the surface of the wafer 109 at t=0 is $\theta_0$.

Figure 10B:
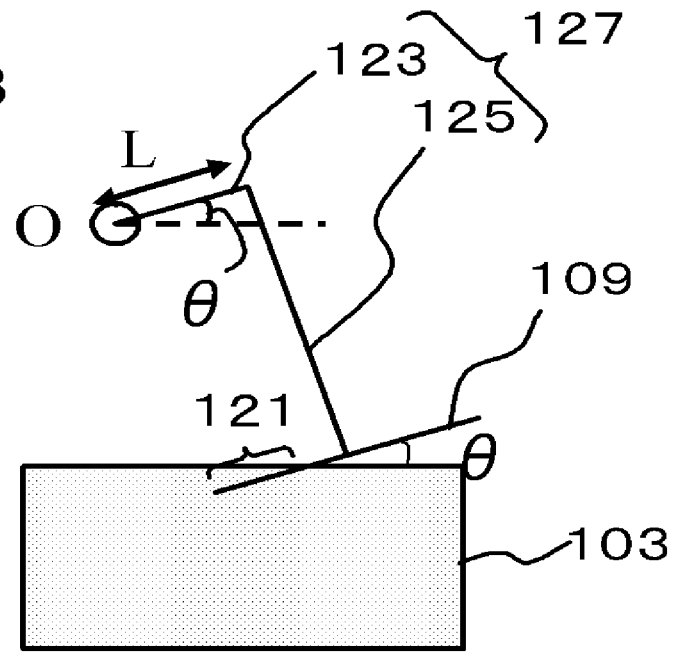

As the wafer holding part 127 is further rotated, an immersed area 121 gradually increases while an inclination angle θ gradually decreases (FIG. 10B).

Then, at a given time t, the whole surface of the wafer 109 is immersed in the plating solution 103, where an inclination angle is $\theta_1$ (FIG. 11A).

Then, the wafer holding part 127 continues to rotate until θ=0. At θ=0, a distance between the liquid surface and the wafer 109 is d (FIG. 11B).

Among these operations, the statuses in FIGS. 10A, 10B and 11A correspond to the first step described above. Here, the current controller 131 controls an applied current to meet the conditions of the above equation (1), further taking fluctuation in θ into account. The statuses after FIG. 11A correspond to the second step, where the current controller 131 applies a constant current between the Cu anode electrode 105 and the cathode electrode 107. FIG. 12 further details the status in FIG. 10B. In FIG. 12, there is a relationship: (i)+(ii)=(iii)+(iv). Furthermore, a=r corresponds to the time of contacting with the liquid (θ=$\theta_0$) while a=−r corresponds to the time of immersion (θ=$\theta_1$). Therefore, as shown in FIG. 13, $$L \sin\theta + R - d = R \cos\theta + a \sin\theta,$$

$$a = \{L \sin\theta + R(1 - \cos\theta) - d\} / \sin\theta.$$

Thus, in equation (1), that is, $I = (I_0 / \pi r^2) \times S = I_0(\phi - \cos\phi \sin\phi)/\pi(1)$, $$\cos\phi = a/r = \{L \sin\theta + R(1 - \cos\theta) - d\} / r \sin\theta,$$

$$\theta = \theta_0 - \omega t, 0 \leq t \leq (\theta_0 - \theta_1)/\omega,$$

$$R \cos\theta_0 + (-L + r) \sin\theta_0 = R - d,$$

$$R \cos\theta_1 + (-L - r) \sin\theta_1 = R - d.$$

According to this embodiment, even when an inclination angle θ varies depending on t, local increase in a current density and fluctuation in a plating film thickness can be prevented as in embodiment 1, because a current is controlled in proportion to a contact area of the wafer 109 with the plating solution 103.

Embodiment 4

In the first step in the above embodiments, immersion of the wafer 109 may be initiated with applying a given voltage between the Cu anode electrode 105 and the cathode electrode 107. Specifically, before the wafer 109 comes into contact with the plating solution 103, a constant voltage of higher than 0 V to 0.1 V or lower is applied. Applying a voltage higher than 0 V may allow a current intensity in the first step to be more reliably controlled. Applying a voltage of 0.1 V or lower may result in further stable film formation in step 101.

Thus, even when accurate monitoring of liquid-contact timing of the wafer 109 is difficult based on a lowering speed of the wafer 109 alone, a current between the Cu anode electrode 105 and the cathode electrode 107 can be monitored. Such monitoring of the current intensity can allow a current intensity in the first step to be more reliably controlled.

In the first step, instead of making the power source 1150N at t=0, that is, the time when the wafer 109 contacts with the plating solution 103, and then increasing a current from 0 A, a current may be applied from an initial intensity corresponding to 0.1 V. Thus, the second step can be initiated correspondingly earlier, resulting in further reduction in a time required for a plating process.

Embodiment 5

This embodiment relates to a semiconductor device manufactured using the plating apparatus or the plating process described in any of the above embodiments.

Figure 14:
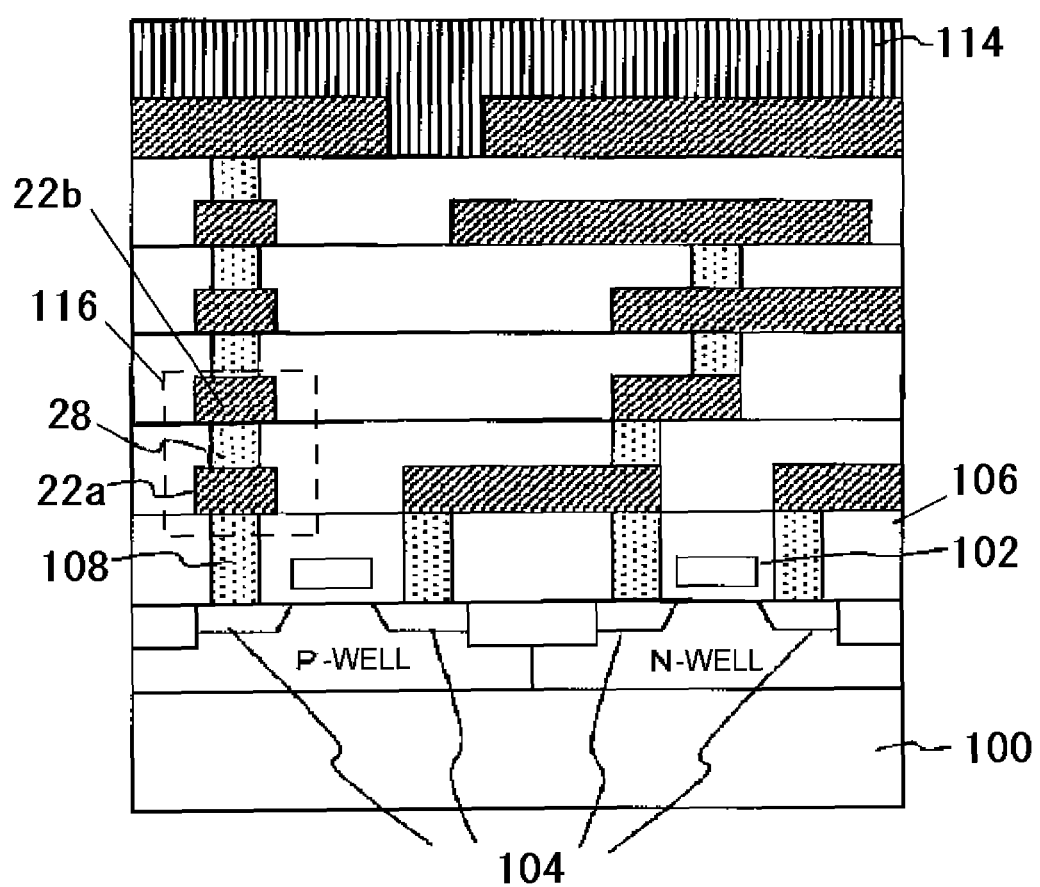
FIG. 14 is a cross-sectional view of a configuration of a semiconductor device according to this embodiment.

FIG. 14 is a cross-sectional view illustrating a configuration of a semiconductor device of this embodiment. FIG. 14 shows a semiconductor device including a MOS transistor having a gate electrode 102 and a diffusion layer 104 and the like on the semiconductor substrate 100. An insulating film 106 is formed such that it covers the MOS transistor. A copper connection plug 108 is formed to connect to the diffusion layer 104 in the insulating film 106, on which are sequentially formed a first copper interconnection 22a, a connection plug 28 and a second copper interconnection 22b. The copper interconnection layers having the same structure are formed on these layers and a passivation film 114 is formed on the uppermost layer. The first copper interconnection 22a is electrically connected to, for example, an element formed on the silicon substrate 100. The first copper interconnection 22a, the connection plug 28 and the second copper interconnection 22b, which will be described below, may be formed in any layer in the semiconductor device shown in FIG. 14.

There will be further described about the interconnection structure and a process for manufacturing it with reference to an interconnection structure in a dot-line enclosure 116 in FIG. 14.

The manufacturing process according to this embodiment has the step of forming a metal film on the wafer 109 by the plating process as described in any of the above embodiments. The manufacturing process of this embodiment has the step of preparing the wafer 109 in which a transistor is formed on a circular silicon wafer, wherein the step of forming a metal film is included in the process for forming a conductive pattern made of a metal film over the transistor.

Figure 15:
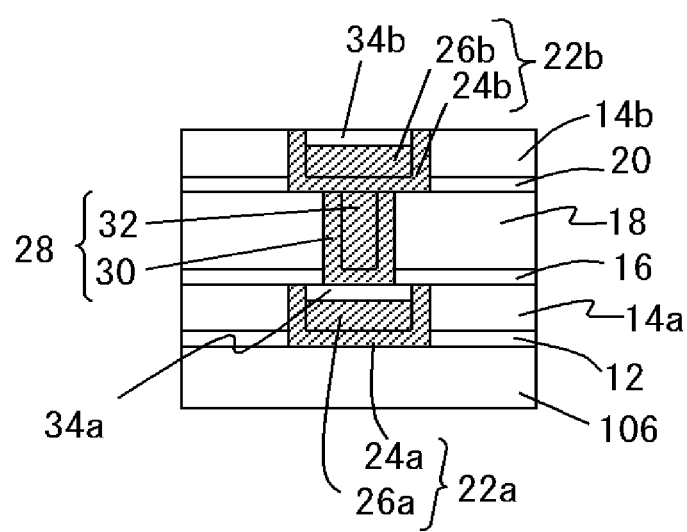
FIG. 15 is a cross-sectional view illustrating an interconnection structure in the dot-line enclosure in FIG. 14 in detail.

FIG. 15 is detail of a cross-sectional view illustrating the interconnection structure in the dot-line enclosure 116 in FIG. 14. A first stacked film 14a having a first SiCN film 12, an L-Ox (a ladder type siloxane, trade name) and $SiO_2$ in sequence and a second stacked film 14b having a second SiCN film 16, a silicon oxide film 18, a third SiCN film 20, L-ox and $SiO_2$ in sequence are sequentially formed on an insulating film 106 over a silicon substrate (not shown). A first copper interconnection 22a and a second copper interconnection 22b are formed in the first stacked film 14a and the second stacked film 14b, respectively.

The first copper interconnection 22a has a tantalum-containing barrier metal film 24a and a copper film 26a. A connection plug 28 connected to the upper surface of the first copper interconnection 22a is formed in the silicon oxide film 18. The connection plug 28 consists of a tantalum-containing barrier metal film 30 and a copper film 32. The second copper interconnection 22b connected to the upper surface of the connection hole is formed in the second stacked film 14b. The second copper interconnection 22b has a tantalum-containing barrier metal film 24b and a copper film 26b. A first Cu silicide film 34a and a second Cu silicide film 34b are formed on the upper surfaces of the first copper interconnection 22a and the second copper interconnection 22b, respectively.

There will be described a process for manufacturing the interconnection structure shown in FIG. 15 with reference to FIGS. 16A to 16E, 17A to D and 18A to 18E.

Figure 16A:
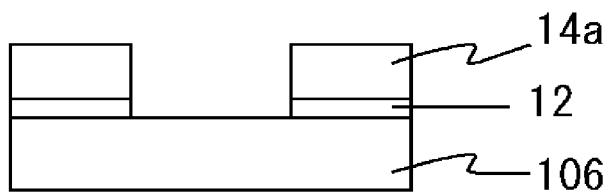
FIGS. 16A to 16E are cross-sectional views showing a process for manufacturing the interconnection structure in FIG. 15.

FIG. 16A shows a structure where an interconnection trench is formed in the first SiCN film 12 and the first stacked film 14a. The structure is formed by depositing the first SiCN film 12 and the first stacked film 14a, then formed a resist film patterned with predetermined shape (not shown) and etched stepwise the first SiCN film 12 and the first stacked film 14a using the resist pattern.

Figure 16B:
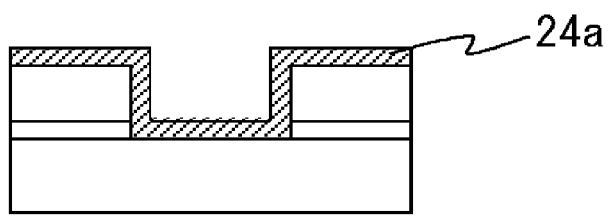

Next, a tantalum-containing barrier metal film 24a as a multilayer of Ta and TaN is formed over the whole surface of the substrate by sputtering and reactive sputtering (FIG. 16B).

Figure 16C:
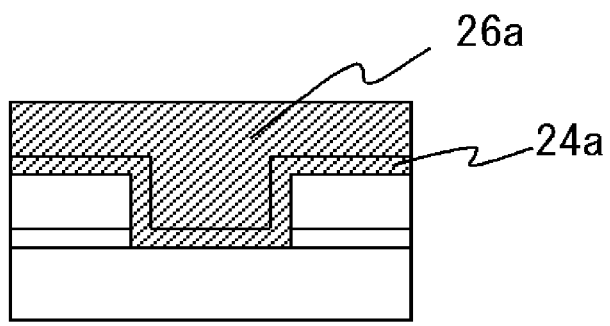

Then, as shown in FIG. 16C, a copper film 26a is formed on the tantalum-containing barrier metal film 24a. The copper film 26a is formed as described below by the plating process in any of the above embodiments. First, a seed copper film made of copper for copper plating is formed by sputtering. Subsequently, the substrate is immersed in an aqueous cupric sulfate solution at about 25° C., and a copper film 26a is formed by electrolytic plating. Alternatively, the substrate can be annealed after the plating. By annealing, the grain size of the copper film 26a becomes larger than that before annealing, so that the number of sites where a plurality of grain boundaries exposed in the surface of the copper film 26a overlap is relatively reduced, resulting in less cavities. Furthermore, such heating treatment may have an effect that a resistance of the first copper interconnection 22a becomes lower than that before the annealing. This annealing may be conducted, for example, at a temperature of 200° C. to 500° C. both inclusive.

Figure 16D:
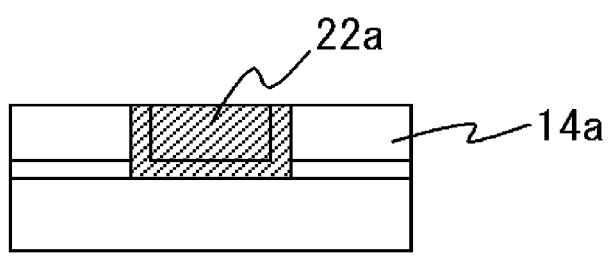
Figure 16E:
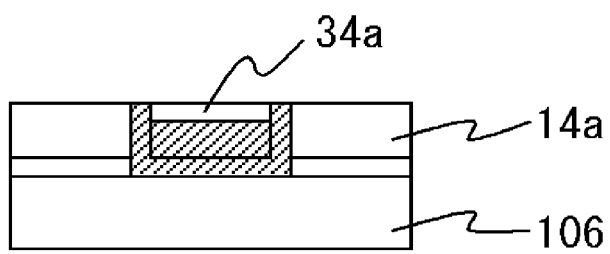

Then, the excessive copper film 26a and the excessive tantalum-containing barrier metal film 24a formed outside the interconnection trench are removed by chemical mechanical polishing (CMP) with leaving the copper film 26a and so forth only within the interconnection trench to form the first copper interconnection 22a (FIG. 16D). Then, as shown in FIG. 16E, the surface of the copper film 26a is silicided to form a first Cu silicide film 34a on the surface of the copper film 26a in the first copper interconnection 22a.

Figure 17A:
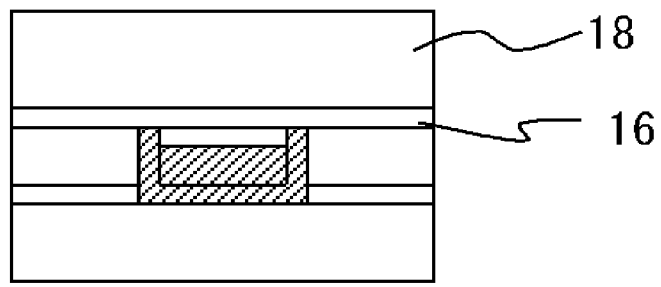
FIGS. 17A to 17D are cross-sectional views showing a process for manufacturing the interconnection structure in FIG. 15.
Figure 17B:
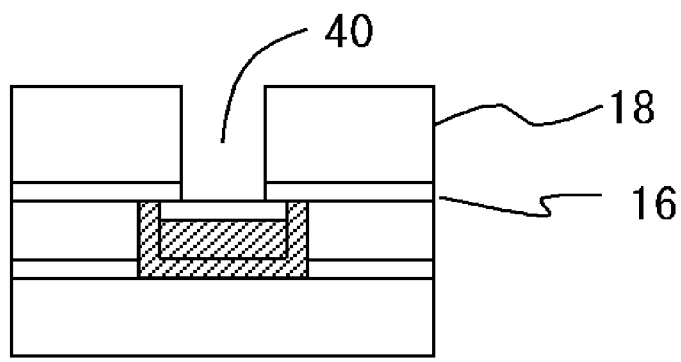

Next, a second SiCN film 16 and a silicon oxide film 18 are deposited (FIG. 17A). Then, the silicon oxide film 18 is patterned and etched until the second SiCN film 16 is exposed. Then, after changing an etching gas, the second SiCN film 16 is etched to expose the upper surface of the first Cu silicide film 34a. Thus, as shown in FIG. 17B, a connection hole 40 is formed.

Figure 17C:
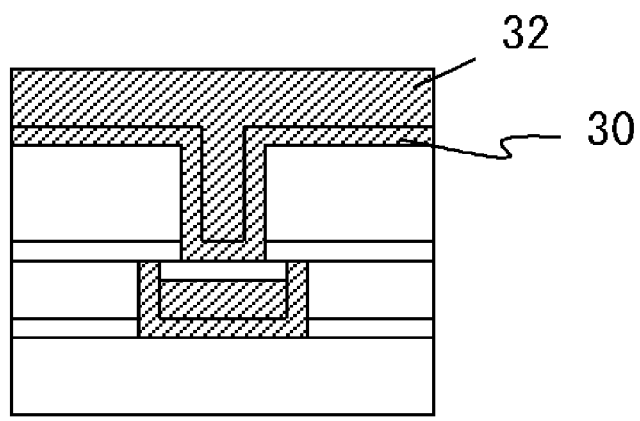
Figure 17D:
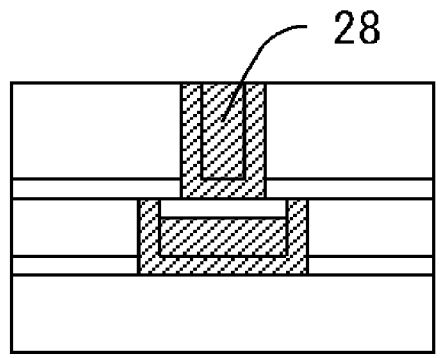

Then, a tantalum-containing barrier metal film 30 and a copper film 32 are sequentially formed such that they fill the inside of the connection hole 40 (FIG. 17C). The copper film 32 is formed by the plating process described in any of the above embodiments as is for the copper film 26a in the first copper interconnection 22a. Subsequently, the product is planarized by CMP to form a connection plug 28 (FIG. 17D).

Figure 18A:
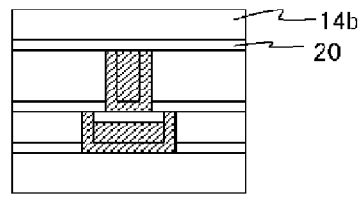
FIGS. 18A to 18E are cross-sectional views showing a process for manufacturing the interconnection structure in FIG. 15.
Figure 18B:
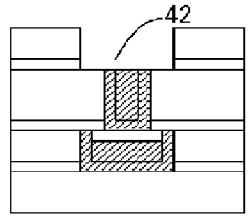
Figure 18C:
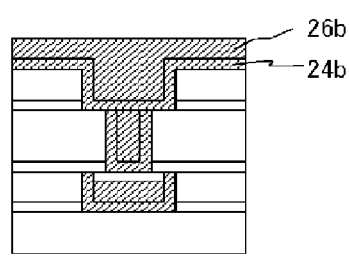
Figure 18D:
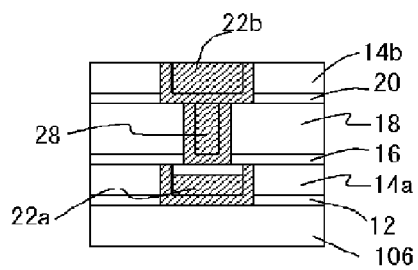
Figure 18E:
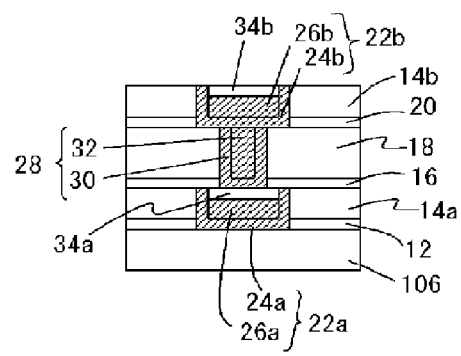
Figure 19:
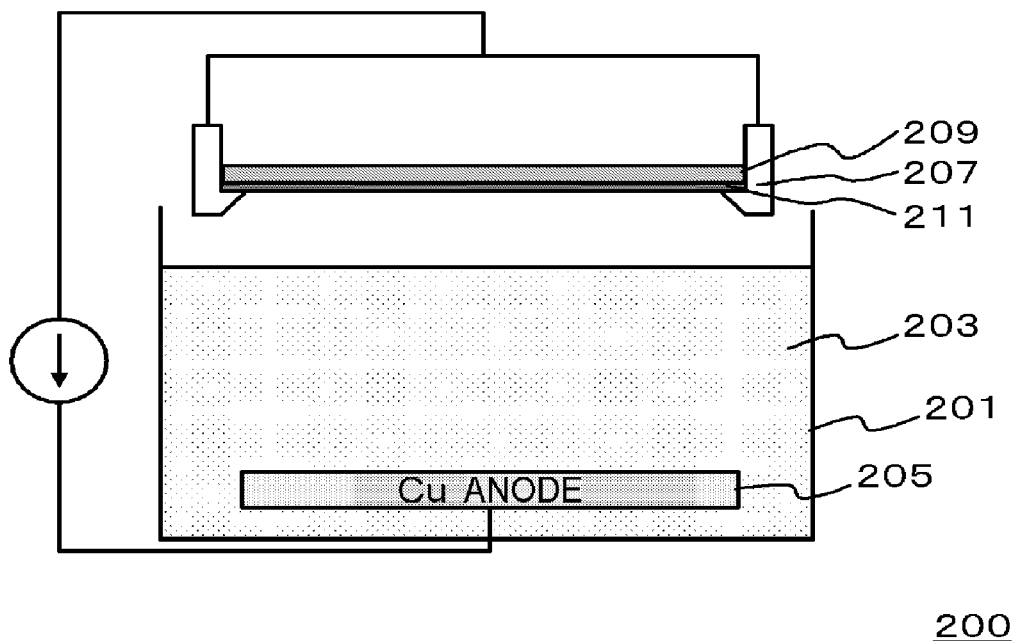
FIG. 19 is a cross-sectional view showing a configuration of a plating apparatus according to the related art.
Figure 20:
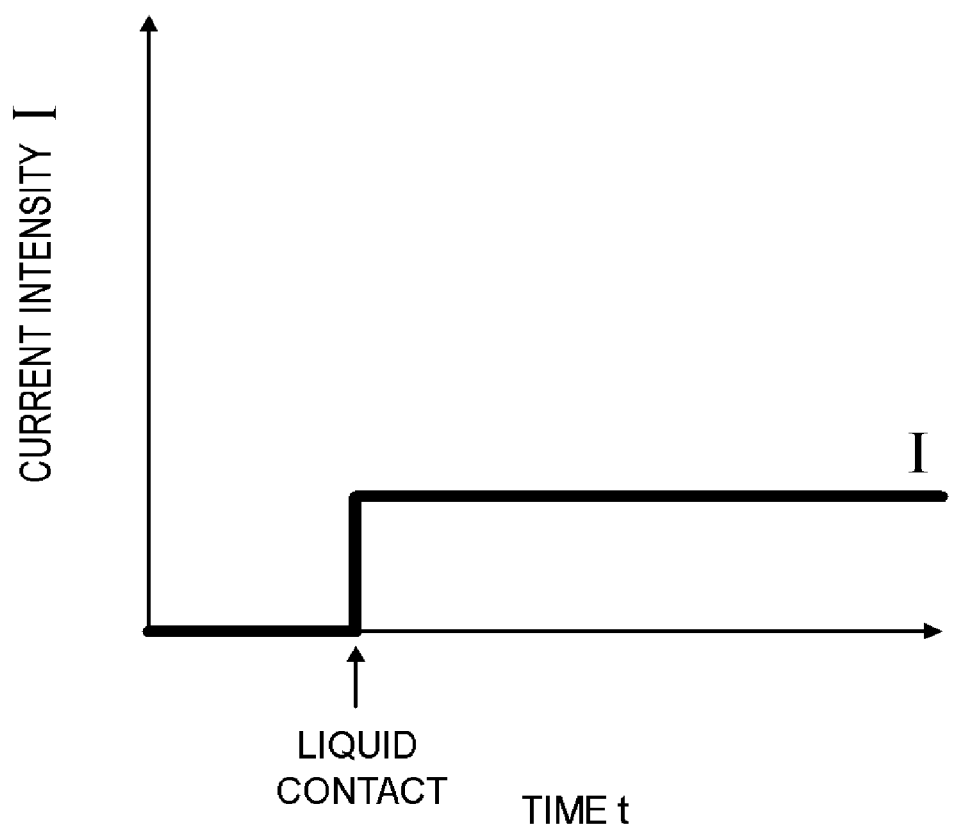
FIG. 20 shows relationship between an elapsed time and a current density in a plating process according to the related art.
Figure 21:
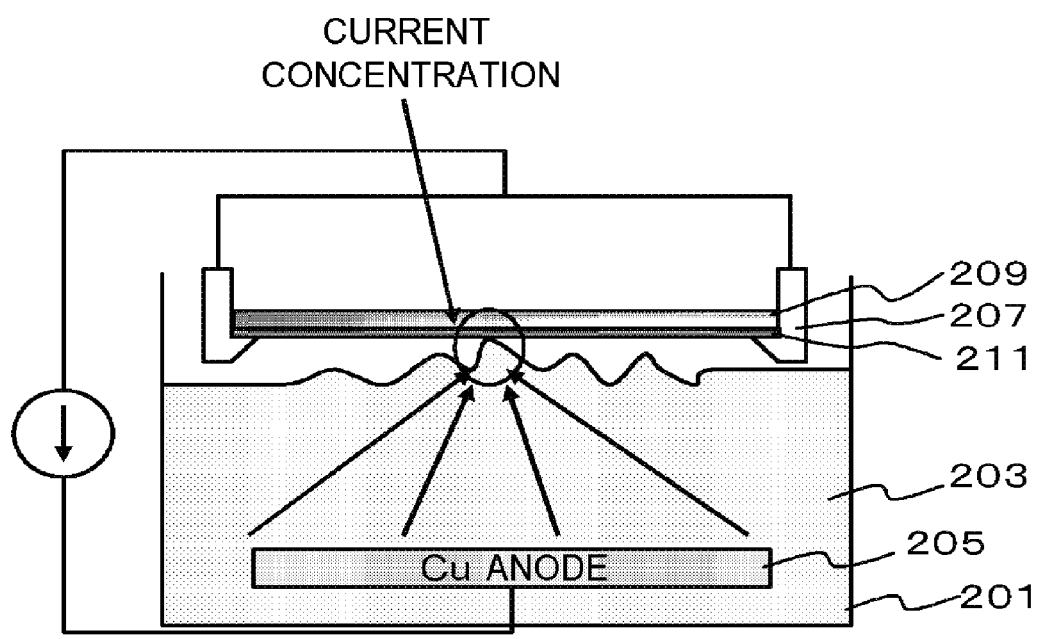
FIG. 21 is a cross-sectional view illustrating a configuration of a plating apparatus according to the related art.
Figure 22:
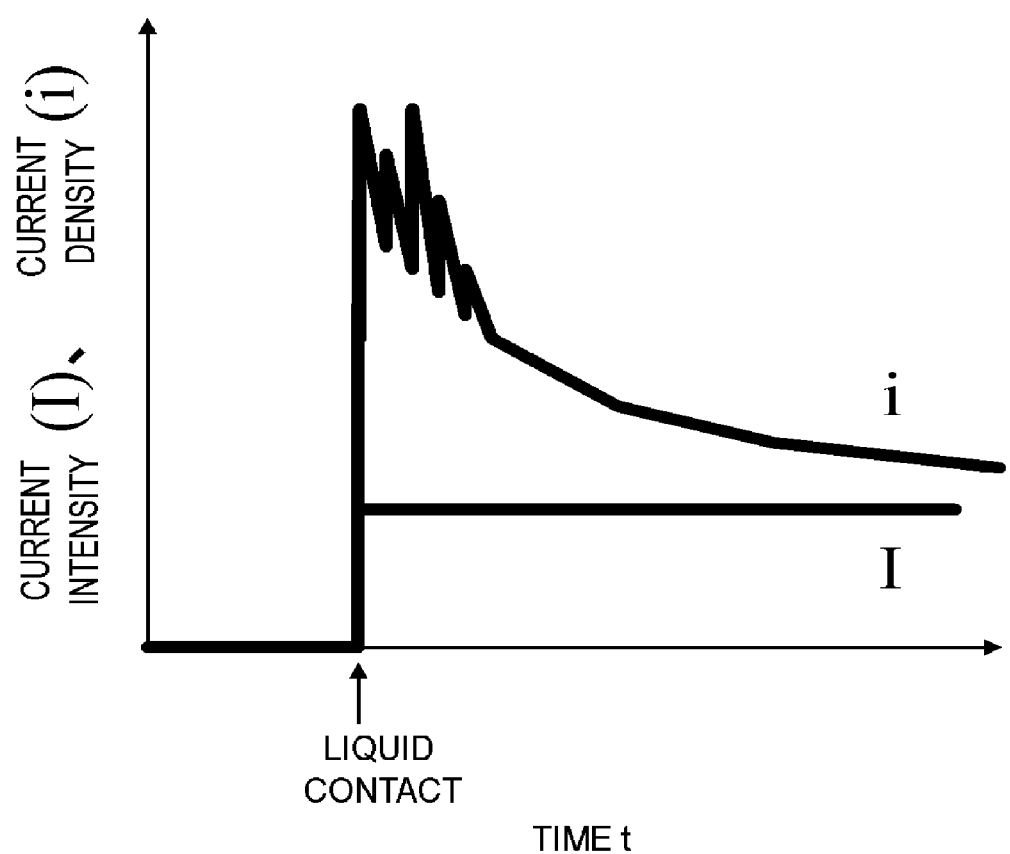
FIG. 22 shows relationship between a plating time and a current density in a plating process according to the related art.
Figure 23:
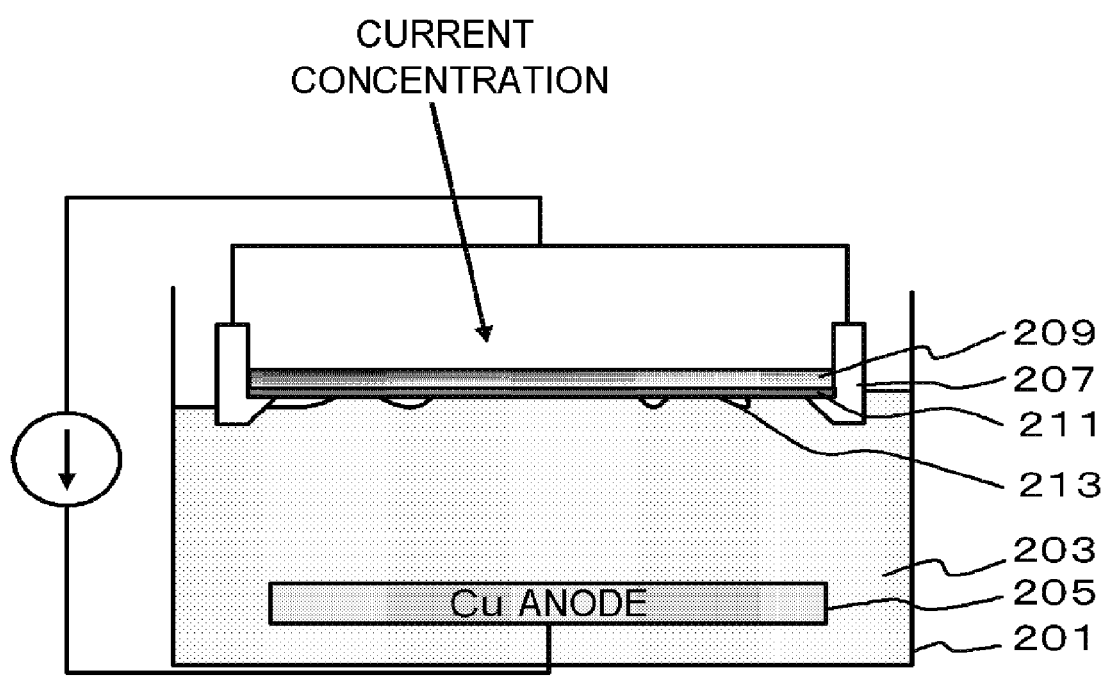
FIG. 23 is a cross-sectional view illustrating a configuration of a plating apparatus according to the related art.
Figure 24:
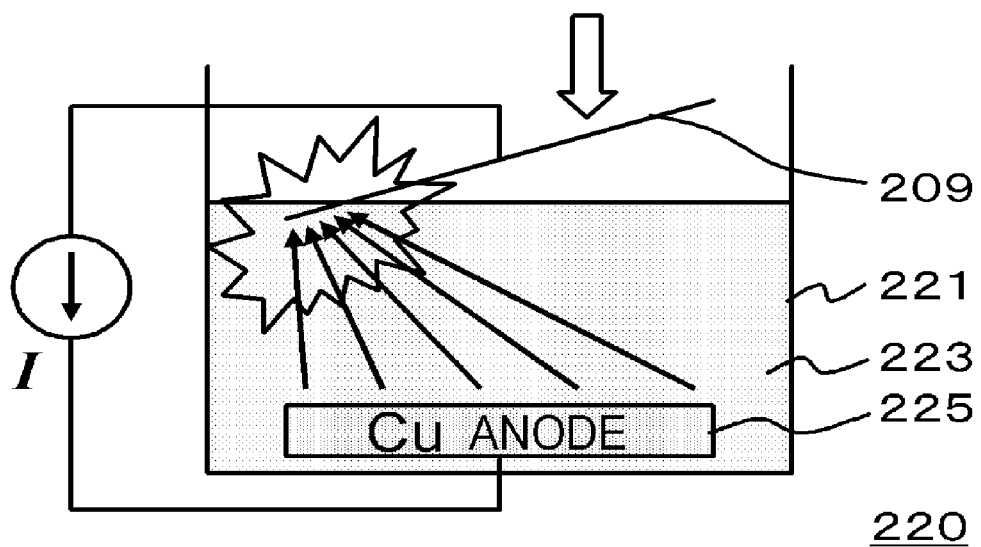
FIG. 24 is a cross-sectional view illustrating a configuration of a plating apparatus according to the related art.
Figure 25:
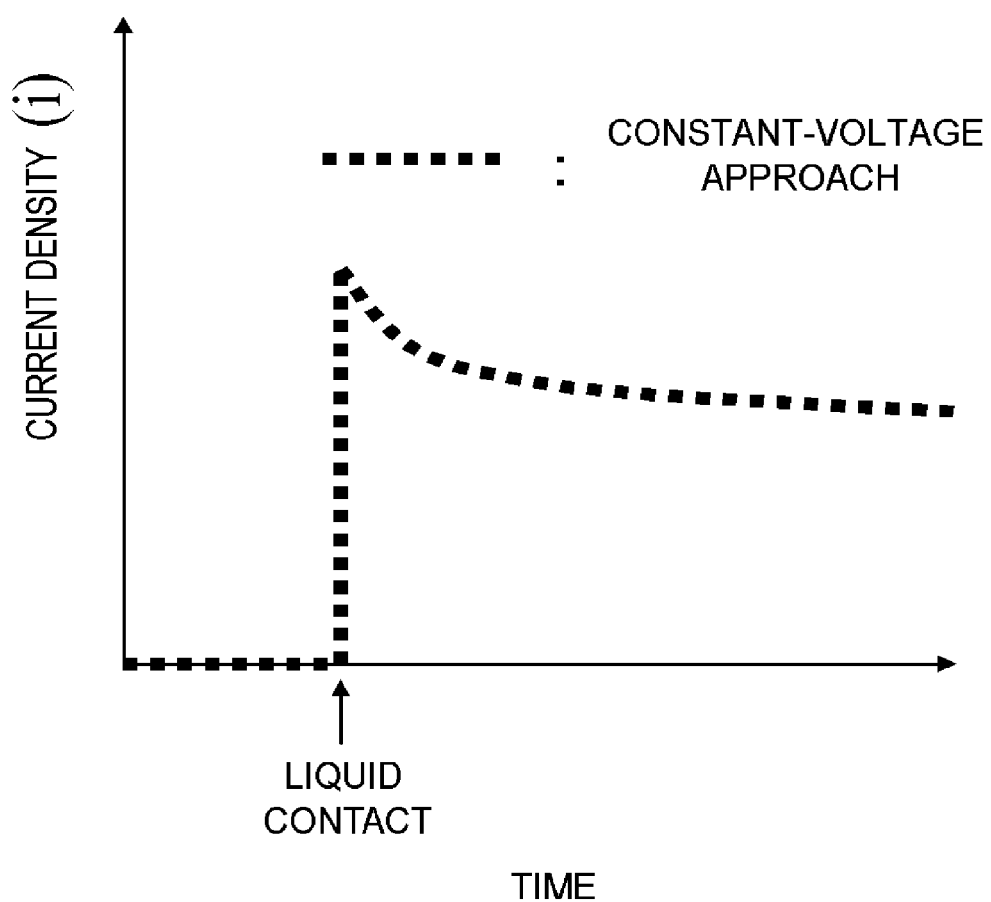
FIG. 25 shows relationship between a plating time and a current density in a plating process according to the related art.

Then, a third SiCN film 20 and a second stacked film 14b are deposited over the connection plug 28 (FIG. 18A), and an interconnection trench 42 is formed by dry etching (FIG. 18B). Then, a tantalum-containing barrier metal film 24b and a copper film 26b are sequentially formed to fill the inside of the trench 42 (FIG. 18C). The copper film 26b is formed by the plating process described in any of the above embodiments, as described for the copper film 26a in the first copper interconnection 22a. Next, the product is planarized by CMP to form a second copper interconnection 22b (FIG. 18D). The upper surface of the second copper interconnection 22b is silicided to form a second Cu silicide film 34b (FIG. 18E).

Thus, the interconnection structure shown in FIG. 15 is formed. Then, the above steps can be repeated to form a semiconductor device having a multilayer interconnection with three or more layers as shown in FIG. 14.

In this embodiment, when forming a copper interconnection, the plating process described in any of the above embodiments is used to form a Cu film grown in the interconnection trench. Thus, fluctuation in a current density during forming the Cu film can be prevented, resulting in reduction in variation in a thickness of the plating film on a substrate. Therefore, the Cu film constituting the copper interconnection can be stably formed. Thus, the semiconductor device according to this embodiment can be manufactured in an improved yield.

The present invention has been described with reference to some embodiments. It will be understood by those skilled in the art that these embodiments are merely illustrative and that there may be many variants and these variations are also within the scope of the present invention.

For example, although there has been described a case where a Cu film is formed in the above embodiments, a plating film may be, instead of a Cu film, another metal film such as an Al film and an Ni film, or an alloy film containing at least one of Cu, Al and Ni.

Furthermore, in the above embodiments, the data memory 135 may store a plurality of controlling equations for a current intensity applied between the Cu anode electrode 105 and the cathode electrode 107 in the first step, so that a controlling method for a current intensity can be selected in the controller 117.

Although there has been described a case where a current intensity is controlled on the basis of a given inclination angle, a lowering speed and an elapsed time after the wafer contacts with the liquid in the above embodiments, a lowering speed of the wafer 109 may be controlled on the basis of a given inclination angle and a current intensity.

It is apparent that the present invention is not limited to the above embodiment, that may be modified and changed without departing from the scope and spirit of the invention.

What is claimed is:

1. A plating process comprising
a first step of connecting a film-formation surface of a wafer to a cathode electrode, inclining the wafer to the surface of a plating solution and immersing the wafer into the plating solution with applying a first current between the cathode electrode and an anode electrode placed in the plating solution, and
a second step of, after immersing the film-formation surface in the plating solution, applying a second current between the cathode electrode and the anode electrode to form a metal film on the film-formation surface by electrolytic plating,
wherein in the first step, the first current is controlled on the basis of an inclination angle between the liquid surface and the film-formation surface,
wherein the first current is represented by the following equation (1):

$$I = I_0(\phi - \cos\phi \sin\phi)/\pi \quad (1)$$

wherein $I_0$ is an intensity of the second current and $2\phi$ is an angle made by straight lines passing through the wafer center and intersections of outer edge of the wafer with the surface of the plating solution.

2. The plating process as claimed in claim 1, wherein in the first step, a liquid-contact area in the wafer is a function of the inclination angle as a variable and the first current varies depending on the liquid-contact area.

3. The plating process as claimed in claim 2, wherein in the first step, the first current is varied in proportion to the liquid-contact area.

4. The plating process as claimed in claim 1, wherein in the first step, immersion of the wafer is initiated with applying a given voltage between the anode electrode and the cathode electrode.

5. The plating process as claimed in claim 1, wherein in the second step, the second current is substantially constant.

6. The plating process as claimed in claim 1, wherein the metal film is a copper-containing metal film.

7. The plating process as claimed in claim 4, wherein controlling the first current on the basis of the inclination angle between the liquid surface and the film-formation surface includes:
measuring the inclination angle between the liquid surface and the film-formation surface;
calculating the liquid-contact area from the measured inclination angle between the liquid surface and the film-formation surface; and
varying the current based on the calculated liquid-contact area.

8. A process for manufacturing a semiconductor device having a metal film, comprising forming the metal film on a wafer by the plating process as claimed in claim 1.

9. The process for manufacturing a semiconductor device as claimed in claim 8,
comprising preparing the wafer in which a transistor is formed on a silicon wafer,
wherein said forming a metal film is included in a process for forming a conductive pattern made of the metal film over the transistor.

10. A plating process comprising
a first step of connecting a film-formation surface of a wafer to a cathode electrode, inclining the wafer to the surface of a plating solution and immersing the wafer into the plating solution with applying a first current between the cathode electrode and an anode electrode placed in the plating solution, and
a second step of, after immersing the film-formation surface in the plating solution, applying a second current between the cathode electrode and the anode electrode to form a metal film on the film-formation surface by electrolytic plating,
wherein in the first step, the first current is controlled on the basis of an inclination angle between the liquid surface and the film-formation surface,
wherein in the first step, the inclination angle is substantially constant,
wherein the wafer is immersed into the plating solution at a substantially constant speed,
wherein the first current is represented by the following equation (1):

$$I = I_0(\phi - \cos\phi \sin\phi)/\pi \quad (1)$$

wherein $I_0$ is an intensity of the second current; $2\phi$ is an angle made by straight lines passing through the wafer center and intersections of outer edge of the wafer with the surface of the plating solution; $\phi$ meets the condition: $\cos\phi = (r - vt/\sin\theta)/r$; r is a radius of the wafer; $\theta$ is the inclination angle; v is a moving speed of the wafer in the direction of the normal line in the liquid surface; and $0 \leq t \leq 2r \sin \theta / v$.

11. A plating process comprising
a first step of connecting a film-formation surface of a wafer to a cathode electrode, inclining the wafer to the surface of a plating solution and immersing the wafer into the plating solution with applying a first current between the cathode electrode and an anode electrode placed in the plating solution, and
a second step of, after immersing the film-formation surface in the plating solution, applying a second current between the cathode electrode and the anode electrode to form a metal film on the film-formation surface by electrolytic plating,
wherein in the first step, the first current is controlled on the basis of an inclination angle between the liquid surface and the film-formation surface,
wherein in the first step, the inclination angle is substantially constant,
wherein the wafer is immersed into the plating solution at a substantially constant speed,
wherein the first current is represented by the following equation (3):

$$I = v I_0 t / 2r \sin \theta \quad (3)$$

wherein $I_0$ is an intensity of the second current; r is a radius of the wafer; θ is the inclination angle; v is a moving speed of the wafer in the direction of the normal line of the liquid surface; and $0 \leq t \leq 2r \sin \theta / v$.

12. A plating process comprising
a first step of connecting a film-formation surface of a wafer to a cathode electrode, inclining the wafer to the surface of a plating solution and immersing the wafer into the plating solution with applying a first current between the cathode electrode and an anode electrode placed in the plating solution; and
a second step of, after immersing the film-formation surface in the plating solution, applying a second current between the cathode electrode and the anode electrode to form a metal film on the film-formation surface by electrolytic plating;
wherein in the first step, the first current is controlled on the basis of an inclination angle between the liquid surface and the film-formation surface;
wherein in the first step, a liquid-contact area in the wafer is a function of the inclination angle as a variable and the first current varies depending on the liquid-contact area;
wherein in the first step, the inclination angle is substantially constant;
wherein in the first step, the first current is supplied from a power source.

13. The plating process as claimed in claim 12, wherein controlling the first current on the basis of the inclination angle between the liquid surface and the film-formation surface includes:
measuring the inclination angle between the liquid surface and the film-formation surface;
calculating the liquid-contact area from the measured inclination angle between the liquid surface and the film-formation surface; and
varying the current based on the calculated liquid-contact area.

14. The plating process as claimed in claim 12, wherein in the first step, the first current is varied in proportion to the liquid-contact area.

15. The plating process as claimed in claim 12, wherein the wafer is immersed into the plating solution at a substantially constant speed.

16. The plating process as claimed in claim 12, wherein in the first step, immersion of the wafer is initiated with applying a given voltage between the anode electrode and the cathode electrode.

* * * * *